United States Patent [19]

Hosoba et al.

[11] Patent Number: 5,498,568
[45] Date of Patent: Mar. 12, 1996

[54] METHOD OF PRODUCING A COMPOUND SEMICONDUCTOR CRYSTAL LAYER WITH A STEEP HETEROINTERFACE

[75] Inventors: Hiroyuki Hosoba, Souraku; Junichi Nakamura, Tenri; Masanori Watanabe, Nara, all of Japan

[73] Assignee: Sharp Kabushiki Kaisha, Japan

[21] Appl. No.: 456,870

[22] Filed: Jun. 1, 1995

[30] Foreign Application Priority Data

Jun. 30, 1994 [JP] Japan .................................. 6-149095
Nov. 25, 1994 [JP] Japan .................................. 6-290978
Apr. 14, 1995 [JP] Japan .................................. 7-089597

[51] Int. Cl.$^6$ .................................................. H01L 21/20
[52] U.S. Cl. .......................... 437/129; 437/126; 437/133; 117/84; 117/88; 117/89
[58] Field of Search .................................. 437/129, 133, 437/126; 117/84, 89, 88

[56] References Cited

U.S. PATENT DOCUMENTS 5,037,674  8/1991  Kojima et al. .................... 117/89
5,204,284  4/1993  Kuo et al. ........................ 437/129

FOREIGN PATENT DOCUMENTS 2102200  4/1990  Japan .
2-254715  7/1990  Japan .

*Primary Examiner*—R. Bruce Breneman
*Assistant Examiner*—Ramamohan Rao Paladugu
*Attorney, Agent, or Firm*—Nixon & Vanderhye

[57] ABSTRACT

After a GaAs substrate is set in a reaction container, the pressure in the reaction container is reduced to 10–100 torr and arsine is supplied into the container. A GaAs buffer layer is formed on the GaAs substrate by introducing TMG when the surface temperature of the GaAs substrate is at 650° C. Then, by stopping supply of TMG, the growth of the GaAs buffer layer is stopped (step I). Arsine is switched to phosphine. A time t after the switching, TMA, TMG and TMI adjusted at a predetermined mixing ratio beforehand are introduced into the container, thereby starting the formation of an InGaAlP layer on the GaAs buffer layer. During the growing process, the surface temperature of the GaAs substrate is raised to 750° C. (step II). The InGaAlP layer is grown to a predetermined thickness with the surface temperature of the GaAs substrate being kept at 750° C. (step III).

17 Claims, 22 Drawing Sheets

11 n—GaAs SUBSTRATE
12 n—$Al_xGa_{1-x}As$ BUFFER LAYER ($0 \leq x \leq 1$)
13 n—$In_y(Ga_{1-x}Al_x)_{1-y}P$ CLAD LAYER ($0 \leq x \leq 1, 0 \leq y \leq 1$)
14 $In_y(Ga_{1-x}Al_x)_{1-y}P$ ACTIVE LAYER ($0 \leq x \leq 1, 0 \leq y \leq 1$)
15 p—$In_y(Ga_{1-x}Al_x)_{1-y}P$ CLAD LAYER ($0 \leq x \leq 1, 0 \leq y \leq 1$)
16 n—$Al_xGa_{1-x}As$ CURRENT BLOCKING LAYER ($0 \leq x \leq 1$)
17 p—GaAs CONTACT LAYER RATIO OF MOLAR FLOW RATE OF V-GROUP GAS TO THAT OF
III-GROUP GAS (V/III RATIO) BEFORE DECREASED IN STEP d1

GROWING TIME IN STEP d1 (min.)

INITIAL RATIO OF MOLAR FLOW RATE OF V-GROUP ELEMENT GAS TO THAT OF III-GROUP ELEMENT GAS (V/III RATIO) IN STEP d1 BEFORE DECREASED

RATIO OF MOLAR FLOW RATE OF V-GROUP ELEMENT GAS TO THAT OF III-GROUP ELEMENT GAS (V/III RATIO) BEFORE DECREASED IN STEP e1

SUBSTRATE SURFACE TEMPERATURE WHEN
ARSINE IS SWITCHED TO PHOSPHINE (°C)

TIME t FROM GAS CHANGE FROM ARSINE TO PHOSPHINE
UNTIL START OF InGaAℓP LAYER GROWTH (sec.)

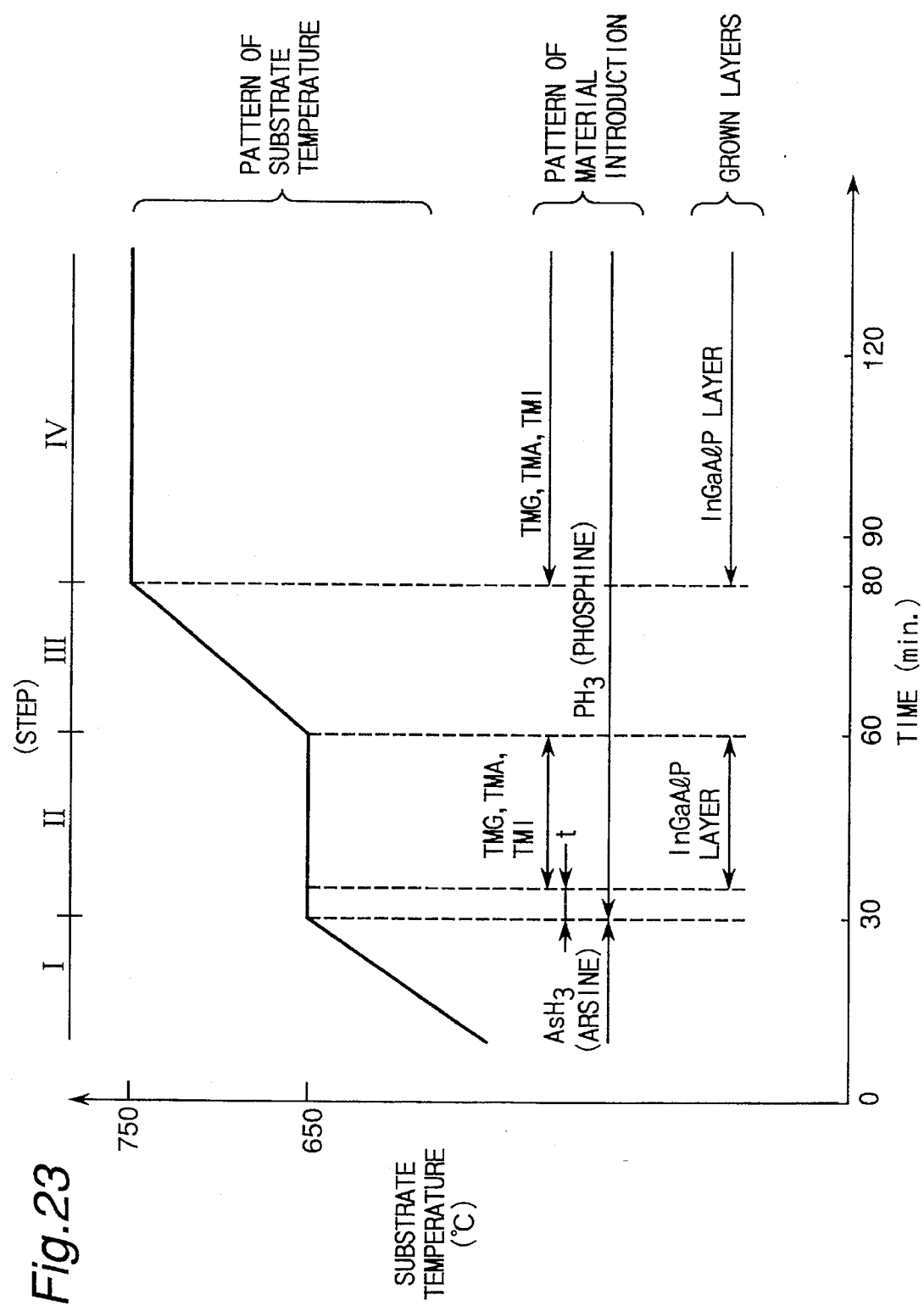

101 n-GaAs SUBSTRATE
102 n-GaAs BUFFER LAYER
103 n-InGaAℓP CLAD LAYER
104 InGaP ACTIVE LAYER
105 p-InGaAℓP CLAD LAYER
106 n-GaAs BLOCKING LAYER
107 p-GaAs CONTACT LAYER

METHOD OF PRODUCING A COMPOUND SEMICONDUCTOR CRYSTAL LAYER WITH A STEEP HETEROINTERFACE

BACKGROUND OF THE INVENTION

1. Field of the Invention

The present invention relates to a method for producing crystal layers of compound semiconductor fit to manufacture semiconductor lasers or light emitting diodes, and more particularly, to a method of producing an InGaAlP layer, which is a compound semiconductor crystal layer, by way of a metal organic chemical vapor deposition (referred to as MOCVD hereinbelow).

2. Description of the Prior Art

InGaAlP layers as crystal layers of compound semiconductor referred to above are important material to manufacture semiconductor lasers and light emitting diodes of a short wavelength. The MOCVD is most often used to grow the InGaAlP layer on a GaAs substrate, and there is a report on semiconductor lasers and light emitting diodes of a short wavelength manufactured according to the MOCVD, which showed favorable features and a long service life.

However, the favorable features and long life of the semiconductor laser or light emitting diode were poorly reproducible, and irregularities in characteristics of the InGaAlP layer on the GaAs substrate have been a problem. That is, a crystal layer of a high Al composition, namely, an InGaAlP layer used as a clad layer of the above-manufactured semiconductor laser or light emitting diode includes crystal defects which deteriorate the characteristics of the device.

For solving the above problem, Japanese Patent Laid-Open Publication No. 2-254715 (254715/1990) proposes a method for producing crystal layers of compound semiconductor by which the surface temperature of the GaAs substrate is raised to as high as 745°–755° C. thereby to grow a good InGaAlP layer without crystal defects.

FIG. 31 is a sectional view of a semiconductor laser manufactured according to the producing method proposed in the above prior art. The semiconductor laser is provided with an n-GaAs substrate 101, an n-GaAs buffer layer 102 formed on the n-GaAs substrate 101, an n-InGaAlP clad layer 103 on the n-GaAs buffer layer 102, an InGaP active layer 104 on the n-InGaAlP clad layer 103, a p-InGaAlP clad layer 105 on the InGaP active layer 104, an n-GaAs blocking layer 106 on the p-InGaAlP clad layer 105 via a p-InGap layer, and a p-GaAs contact layer 107 on the n-GaAs blocking layer 106. FIG. 32 is a diagram showing a process to form the n-GaAs buffer layer 102 and n-InGaAlP clad layer 103 by the producing method. The conventional producing method of the compound semiconductor crystal layer will now be described with reference to FIG. 32.

In the first place, an n-GaAs substrate 101 having a surface thereof purified by chemical etching is set in a reaction container (see FIG. 1) which is in turn vacuumized to 15–100 torr. Then, arsine ($AsH_3$) is introduced into the container. The n-GaAs substrate 101 is heated and kept at 600°–650° C. for 30 minutes. After the substrate 101 is thus purified, TMG (trimethyl gallium) is fed into the container, whereby an n-GaAs buffer layer 102 is grown on the n-GaAs substrate 101. The growth of the n-GaAs buffer layer 102 is then stopped by shutting off the supply of TMG (step a3 in FIG. 32).

Subsequently, the temperature of the n-GaAs substrate 101 is raised to 745°–755° C., i.e., a growing temperature for the InGaAlP layer (step b3 in FIG. 32).

After the surface temperature of the n-GaAs substrate 101 is stabilized at the growing temperature for the InGaAlP layer, the pressure in the reaction container is decreased to 15–35 torr. Phosphine ($PH_3$) is started to be introduced with the arsine stopped. The lapse of a time t (approximately 1 sec.) is awaited for the purpose of replacing the arsine in the reaction container. After the lapse of the time t, TMA (trimethyl aluminum), TMG and TMI (trimethyl indium) of a predetermined mixing ratio are introduced, so that an n-InGaAlP clad layer 103 is formed on the n-GaAs buffer layer 102 (step c3 in FIG. 32).

In the prior art producing method described hereinabove, the n-InGaAlP clad layer 103 is formed after the surface temperature of the n-GaAs substrate 101 is raised to 745°–755° C., thereby attaining the crystal layer of a high Al composition with good crystalline properties. Nevertheless, the n-InGaAlP clad layer 103 includes crystal defects represented by hillocks or the like at a high density, and moreover, As mingles in the n-InGaAlP layer 103 in the vicinity of a heterointerface with the n-GaAs buffer layer 102. As a result, a good (steep) heterointerface cannot be formed between the n-GaAs buffer layer 102 and the n-InGaAlP layer 103.

The reason why the crystal defects represented by the hillocks or the like are generated at a high density is as follows. Since the n-InGaAlP clad layer 103 is grown after the temperature of the n-GaAs substrate 101 is set at high 745°–755° C., P (phosphorus) is separated in the vicinity of the heterointerface of the n-GaAs buffer layer 102 and n-InGaAlP clad layer 103, whereby or by the like reason crystal defects are brought about in the early growing stage of the clad layer 103. The crystal defects affect the growth of the clad layer 103 afterwards.

The reason why As is included in the n-InGaAlP clad layer 3 at the heterointerface between the n-GaAs buffer layer 102 and n-InGaAlP clad layer 103 is that arsine in the reaction container is not sufficiently replaced with phosphine. More specifically, the n-GaAs buffer layer 102 would rapidly decompose without arsine when the surface temperature of the GaAs substrate is 745°–755° C. required for the formation of the good n-InGaAlP clad layer 103, and therefore it is necessary to keep the n-GaAs substrate 101 in an ambience of arsenic immediately before the clad layer 103 starts to grow. As such, after the surface temperature of the n-GaAs substrate 101 is stabilized at the growing temperature of the n-InGaAlP clad layer 103, the supply of arsine is stopped and the supply of phosphine is started, and TMA, TMG and TMI preliminarily regulated at a predetermined mixing ratio are introduced after the elapse of a short replacement time of approximately 1 sec., to start the formation of the n-InGaAlP clad layer 103. Therefore, arsine in the reaction container is not sufficiently replaced by phosphine and As is included into the n-InGaAlP clad layer 103 in the early growth stage, making it impossible to form a steep heterointerface.

SUMMARY OF THE INVENTION

The object of the present invention is therefore to provide a method for producing a compound semiconductor crystal layer which method can form a crystal layer of a high Al composition at high temperatures without generating crystal defects in the early growing stage and without causing inclusion of As in a heterointerface, so as to provide the crystal layer of the high Al composition with a better heterointerface and crystal properties than the conventional methods.

In order to accomplish the above object, an embodiment of the present invention provides a method of producing a compound semiconductor crystal layer wherein an $In_y(Ga_{1-x}Al_x)_{1-y}P$ layer ($0 \leq x \leq 1$, $0 \leq y \leq 1$) is grown on a GaAs substrate directly or via a buffer layer by way of a metal organic chemical vapor deposition method with the use of a III-group material gas including a III-group element or elements and a V-group material gas including a V-group element or elements, which comprises the steps of:

(a) introducing a gas including an arsenic-based material as the V-group material gas into a reaction container for formation of crystals; and (b) switching the V-group material gas from the gas including the arsenic-based material to a gas including a phosphorus-based material, and introducing the III-group material gas into the reaction container, thereby forming an $In_y(Ga_{1-x}Al_x)_{1-y}P$ layer said step (b) consisting of a first period including a time when the $In_y(Ga_{1-x}Al_x)_{1-y}P$ layer is started to grow and a second period following the first period, wherein in said first period a $Q_V/Q_{III}$ ratio of a molar flow rate $Q_V$ of the V-group material gas to a molar flow rate $Q_{III}$ of the III-group material gas is set to a value higher than a predetermined value, and in said second period the $Q_V/Q_{III}$ ratio is lowered from said higher value to the predetermined value and then maintained at the predetermined value.

It is to be noted that in this application a proportion of atoms of each element in the crystal layer is represented by the composition x, y.

In the producing method, when the V-group material gas is switched from an arsenic-based material to a phosphorus-based material in the first period of the (b) step to start the formation of the $In_y(Ga_{1-x}Al_x)_{1-y}P$ layer $0 \leq x \leq 1$, $0 \leq y \leq 1$ (referred to as "InGaAlP layer" hereinbelow), the ratio $Q_V/Q_{III}$ of the molar flow rate $Q_V$ of the V-group material gas to that of the III-group material gas can be set at such a high value that reduces the generation of defects caused by the separation of phosphorus (P). Therefore the separation of P (phosphorus) in the vicinity of the heterointerface between the GaAs substrate and the InGaAlP layer is suppressed, resulting in reduction of crystal defects of the InGaAlP layer. Moreover, by employing an optimum value as a predetermined value for the above $Q_V/Q_{III}$ ratio set in the middle of the growth of the InGaAlP layer in the second period of the (b) step, the resultant InGaAlP layer shows good crystal properties. In another embodiment of the invention, the $Q_V/Q_{III}$ ratio is continuously decreased from the higher value to the predetermined value. Since a sharp change of ratio during the formation of the InGaAlP layer the $Q_V/Q_{III}$ ratio during the formation of the InGaAlP layer is controlled, crystal properties of the InGaAlP layer are improved.

FIG. 4 is a graph indicating a relation between the $Q_V/Q_{III}$ ratio and the density of surface defects when the InGaAlP layer starts to grow in an embodiment to be described later. It is clear from the graph that the density of surface defects is rendered smaller than $10^2$ cm$^{-2}$ when the $Q_V/Q_{III}$ ratio is 500 or larger. Further, it is understood from FIG. 6 showing a graph of a relation between the $Q_V/Q_{III}$ ratio and the half band width of photoluminescence (PL) that the half band width becomes considerably reduced and smaller than 30 meV when the $Q_V/Q_{III}$ ratio is not smaller than 500 as compared with a case where the ratio is smaller than 500.

The higher value of the ratio $Q_V/Q_{III}$ may be set to be 500 or larger. In this case, as is apparent from graphs in FIGS. 4 and 6, therefore, not only the density of surface defects of the InGaAlP layer is reduced to the lowest, but the half width of PL is minimized.

The producing method of an embodiment switches, in the step (b), said V-group material gas and starts to grow the $In_y(Ga_{1-x}Al_x)_{1-y}P$ layer at such a low temperature of the substrate that does not decompose GaAs, and then grows the $In_y(Ga_{1-x}Al_x)_{1-y}P$ layer while raising the temperature of the substrate.

In an embodiment of the invention, when the V-group material gas is switched from the arsenic-based material to the phosphorus-based material to start the formation of the InGaAlP layer, the substrate is held at such a low temperature that does not decompose GaAs. Then, the InGaAlP layer is grown while the temperature of the substrate is raised to a high temperature. The low temperature may set to be not higher than 720° C. and, the high temperature may be in the range of 720°–800° C. which enables obtainment of good crystals.

Since the GaAs substrate is not at a high temperature when the arsenic-based material (e.g., AsH$_3$) is switched to the phosphorus-based material (for instance, PH$_3$), GaAs is prevented from being decomposed and a long switching time from the arsenic-based material to the phosphorus-based material is secured. Thus, the growth of the InGaAlP layer can be started after the arsenic-based material in the reaction container is fully replaced with the phosphorus-based material. Inclusion of As into the InGaAlP layer is thus avoided. Furthermore, crystal defects due to the separation of phosphorus at the heterointerface are prevented. In consequence, a good heterointerface is attained. Particularly when the low temperature is set to be not higher than 720° C., as set forth in claim 5, experiments have proved that the density of surface defects is further decreased than in the prior art. Similarly, it has been also proved that when the high temperature is set to be 720°–800° C., the half width of photoluminescence is reduced to a lower level than in the prior art.

In an aspect of the invention, the step (a) includes a step of growing an $Al_xGa_{1-x}As$ buffer layer ($0 \leq x \leq 1$) on said GaAs substrate. That is, the $Al_xGa_{1-x}As$ buffer layer ($0 \leq x \leq 1$) (referred to as "AlGaAs buffer layer" hereinafter) is formed on the GaAs substrate, and the InGaAlP layer is grown thereon. Owing to the presence of the buffer layer, the surface evenness of the GaAs substrate is improved. Since the substrate is held at the low temperature when the V-group material gas is changed from the arsenic-based material to the phosphorus-based material to form the AlGaAs buffer layer, a sufficient time is allowed to be taken to switch the arsenic-based material to the phosphorus-based material without inviting a rapid decomposition of the AlGaAs buffer layer. Inclusion of As into the InGaAlP layer is thus suppressed. Moreover, crystal defects caused by the separation of P (phosphorus) prone to occur in the vicinity of the heterointerface between the AlGaAs buffer layer and the InGaAlP layer are reduced. Accordingly, a steep heterointerface is obtained.

Another aspect of the present invention provides a method of producing a compound semiconductor crystal layer wherein an $In_y(Ga_{1-x}Al_x)_{1-y}P$ layer ($0 \leq x \leq 1$, $0 \leq y \leq 1$) is grown on a GaAs substrate directly or via a buffer layer by way of a metal organic chemical vapor deposition method with the use of a III-group material gas including a III-group element or elements and a V-group material gas including a V-group element or elements, which comprises the steps of:

(c) introducing an arsenic-based material into a reaction container for formation of crystals;

(d) after the (c) step, setting a substrate temperature of said GaAs substrate at a first temperature not higher than 720° C. and switching the arsenic-based material to a phosphorus-based material; and (e) after the (d) step, a predetermined time later, setting the substrate temperature of the GaAs substrate at a second temperature not higher than 720° C. and starting to grow the $In_y(Ga_{1-x}Al_x)_{1-y}P$ layer.

It is to be noted that the first temperature may be same as or different from the second temperature.

In this method, the surface temperature of the GaAs substrate is set at the first temperature not higher than 720° C. when the arsenic-based material introduced in the reaction container beforehand is exchanged with the phosphorus-based material. Thereafter, the surface temperature is set at the second temperature not higher than 720° C., to grow the InGaAlP layer directly on the GaAs substrate or via the AlGaAs buffer layer.

Since the arsenic-based material in the reaction container is replaced with the phosphorus-based material when the surface temperature of the GaAs substrate is kept low, i.e., 720° C. or lower, the GaAs substrate (or AlGaAs buffer layer) is prevented from being rapidly decomposed, so that a sufficient time is secured for the replacement of the arsenic-based material with the phosphorus-based material. Thus, the arsenic-based material in the reaction container is sufficiently replaced with the phosphorus-based material before the InGaAlP layer starts to grow, and therefore As is prevented from being included in the InGaAlP layer. Also, since the InGaAlP layer starts to grow at a temperature not higher than 720° C., the generation of crystal defects because of the separation of phosphorus in the vicinity of the heterointerface to the GaAs substrate (or the AlGaAs buffer layer) is suppressed. As a result, a good heterointerface is obtained between the GaAs substrate (or AlGaAs buffer layer) and InGaAlP layer.

In an embodiment, the temperature of the substrate is raised to a third temperature (720°–800° C.) which is higher than the first and second temperatures during the growth of the InGaAlP layer which has started to grow at the second temperature. Thereafter, the $In_y(Ga_{1-x}Al_x)_{1-y}P$ layer is grown while the substrate is maintained at the third temperature. Temperatures of 720°–800° C. form good crystals. Due to the above in addition to the formation of a steep heterointerface by preventing both the generation of crystal defects in the early growing stage of the InGaAlP layer and the inclusion of As as well, the present invention can provide a good crystal of the InGaAlP layer.

The (c) step may include a step of growing an $Al_xGa_{1-x}As$ buffer layer ($0 \leq x \leq 1$) on said substrate.

In an embodiment, during the formation of the AlGaAs buffer layer at the (c) step, the temperature of the substrate is raised to the first temperature from the temperature at which the growth of the AlGaAs buffer layer is started. Since the AlGaAs layer is grown while the temperature of the substrate is raised, crystal defects in the AlGaAs buffer layer are reduced, so that crystal properties of the InGaAlP layer formed on the AlGaAs buffer layer are thus enhanced.

In another embodiment, the temperature of the substrate at which the growth of the InGaAlP layer is started is set to be higher than a temperature at which the AlGaAs buffer layer grows. In comparison with a case where the InGaAlP layer is grown at the growing temperature of the AlGaAs buffer layer, crystal defects of the InGaAlP layer in the early growing stage are more reduced, resulting in the growth of a crystal with a small density of crystal defects. Crystal properties of the InGaAlP layer with less crystal defects are further improved.

Meanwhile, according to a further embodiment, the temperature of the substrate at which the growth of the InGaAlP layer is started is set to be lower than a temperature at which the AlGaAs layer grows. If the temperature of the substrate at which the AlGaAs buffer layer is grown is set at an optimum temperature for the growth, for example, 780° C., crystal defects of the AlGaAs buffer layer are decreased, so that the crystal properties of the InGaAlP layer formed on the AlGaAs buffer layer are improved.

In an embodiment, after the InGaAlP layer starts to grow, the growth of the InGaAlP layer is stopped for at least a part of the time during which the temperature of the substrate is raised from the second temperature to the third temperature (720°–800° C.). Generally, when the growing temperature of the InGaAlP layer is changed, the alignment of crystal lattice in the InGaAlP layer and the concentration of carriers are also changed. Therefore, it is necessary to adjust flow rates of material gases and doping materials for the InGaAlP layer in order to make the alignment of crystal gratings and concentration of carriers constant even during the temperature rise. But, the change in flow rates of the materials in turn necessitates the adjustment of a rate of temperature increase for the substrate. In other words, if the InGaAlP layer is grown during the temperature rise of the substrate, troublesome operations for adjusting the flow rates of materials and the rate of temperature increase of the substrate would be required. In the present invention, because the growth of the InGaAlP layer is stopped during the rise of the substrate temperature, the adjustment of the flow rates, and hence, of the heating rate for the substrate is not required while the growth is stopped. Accordingly, the GaAs substrate temperature may be raised to the third temperature in a short time, and the processing time may be eventually shortened. Since the supply of the III-group material gas and doping materials to the reaction container is interrupted during the stop of the growth, the amount of use of the materials is reduced.

According to an aspect of the invention, the growth of the InGaAlP layer is stopped throughout the time during which the substrate temperature is raised from the second temperature to the third temperature, whereby the time required for raising the substrate temperature from the second temperature to the third temperature can be reduced to a minimum. The growth of the $In_y(Ga_{1-x}Al_x)_{1-y}P$ layer is restarted after the third temperature is reached.

Since the InGalP layer is not grown at all during the temperature rise of the substrate in the above method, crystal defects due to the separation of phosphorus during the temperature rise are unavoidable, although, as compared with a case where a GaAs layer forms an undercoating, the amount of defects is smaller because the InGaAlP layer is an undercoating. In order to solve this disadvantage, according to another aspect of the invention, the growth of the InGaAlP layer is stopped only partly during the time when the substrate is raised from the second temperature to the third temperature (720°–800° C.) and restarted at a relatively low temperature of the substrate in the middle of the temperature rise to the third temperature. Accordingly, the generation of crystal defects of the InGaAlP layer while the temperature of the substrate is raised is prevented.

According to still another aspect of the invention, composition x and/or y of the $In_y(Ga_{1-x}Al_x)_{1-y}P$ layer ($0 \leq x \leq 1$, $0 \leq y \leq 1$) grown while the substrate is raised from the second temperature to the third temperature is made different from that of the $In_y(Ga_{1-x}Al_x)_{1-y}P$ layer grown after the third temperature is reached. Thus, the substrate temperature can be set at a growing temperature suitable for the composition of the InGaAlP layer, so that the InGaAlP layer with good crystal properties is obtained.

The producing method according to a further embodiment of the invention grows the $In_y(Ga_{1-x}Al_x)_{1-y}P$ layer while varying the composition x and/or y in at least a part of a whole growing time of the $In_y(Ga_{1-x}Al_x)_{1-y}P$ layer. Since no rapid change in composition of the InGaAlP layer is brought about, the InGaAlP layer has further improved crystal properties.

In summary, any of the embodiments of the invention prevents the separation of phosphorus (P) from and the inclusion of arsenic into the InGaAlP layer in its early growing stage. Moreover, in any of the inventions, the growth of the InGaAlP layer afterwards is proceeded with a suitable ratio of molar flow rates of material gases and/or a suitable temperature of the substrate regulated to obtain good crystallinity. Accordingly, the InGaAlP layer with superior properties and high reliability is formed with good reproducibility. Thus, a semiconductor laser and a light emitting diode of a short wavelength with enhanced properties and high reliability are achieved by any of the inventions.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 2A and 2B illustrate sectional views showing structures of semiconductor lasers to be manufactured in accordance with each embodiment of the present invention, wherein FIG. 2A shows the structure with a buffer layer and FIG. 2B shows the structure without a buffer layer;

FIG. 23 is a diagram of a producing process along a time axis in a ninth embodiment of the present invention;

DETAILED DESCRIPTION OF THE PREFERRED EMBODIMENTS

Figure 1:
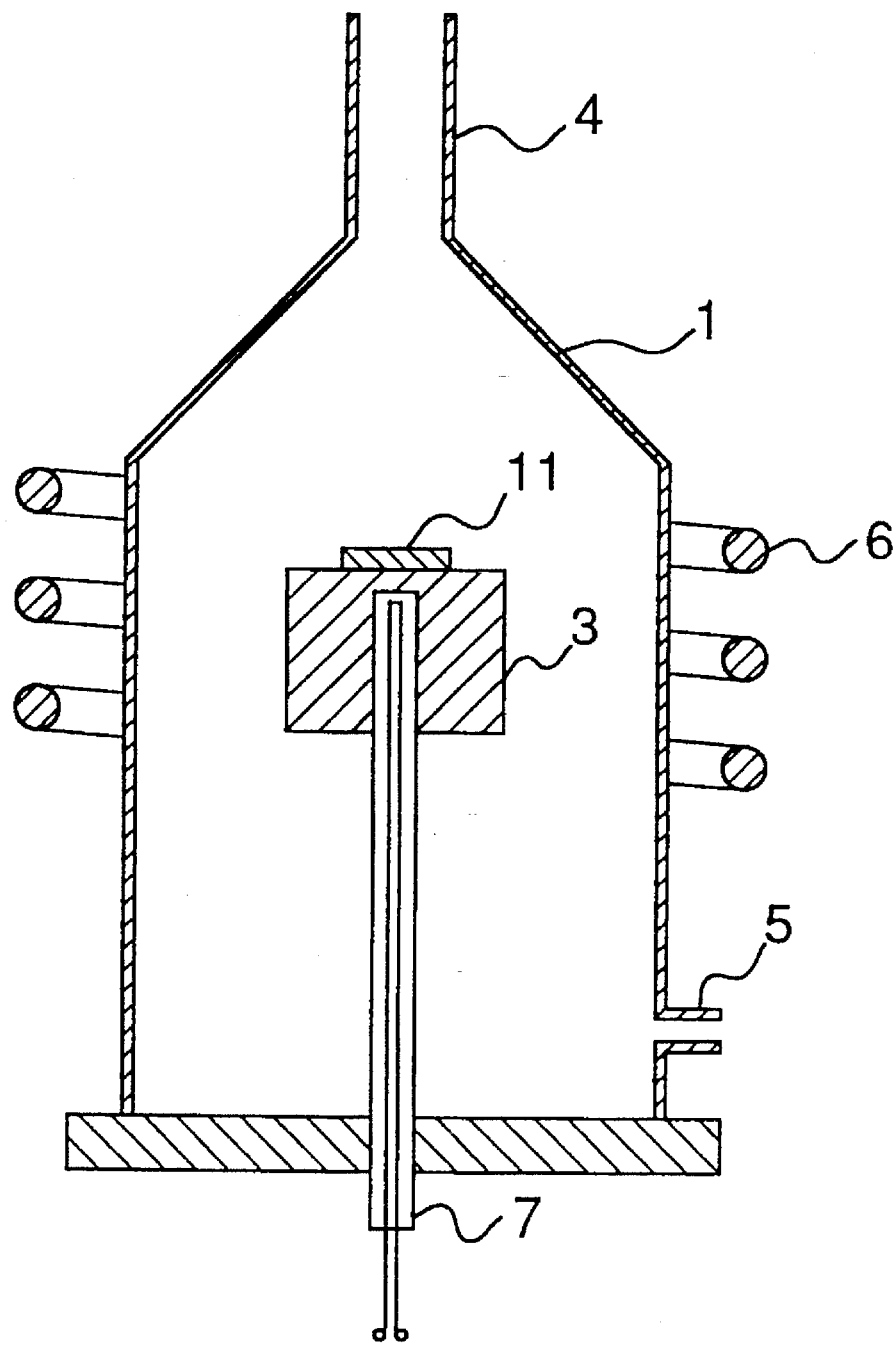
FIG. 1 is a schematic sectional view of a chemical vapor deposition apparatus used in a producing method of crystal layers of compound semiconductor in each embodiment of the present invention.

The present invention will be discussed in detail hereinbelow taken in conjunction with various preferred embodiments thereof shown in the drawings. Suppose that each embodiment below manufactures a semiconductor laser in the structure shown in FIG. 2(A) or FIG. 2(B). In these drawings, reference numeral 11 represents an n-GaAs substrate, reference numeral 12 represents an n-$Al_xGa_{1-x}As$ buffer layer ($0≦x≦1$), reference numeral 13 represents an n-$In_y(Ga_{1-x}Al_x)_{1-y}P$ clad layer ($0≦x≦1$, $0≦y≦1$), reference numeral 14 represents an $In_y(Ga_{1-x}Al_x)_{1-y}P$ active layer ($0≦x≦1$, $0≦y≦1$), reference numeral 15 represents a p-$In_y(Ga_{1-x}Al_x)_{1-y}P$ clad layer ($0≦x≦1$, $0≦y≦1$), reference numeral 16 represents an n-$Al_xGa_{1-x}As$ current blocking layer ($0≦x≦1$), and reference numeral 17 represents a p-GaAs contact layer. The structure shown in FIG. 2(B) is different from that shown in FIG. 2(A) only in the absence of the n-$Al_xGa_{1-x}As$ buffer layer 12. The invention relates to the manufacture of the n-$In_y(Ga_{1-x}Al_x)_{1-y}P$ clad layer 13 formed on the n-GaAs substrate 11 or the n-$Al_xGa_{1-x}As$ buffer layer 12 and therefore, the following description is mainly directed to this point.

In each of the embodiments, trimethyl aluminum (TMA), trimethyl gallium (TMG) and trimethyl indium (TMI) which are methylic organometals are used as materials for the compound semiconductor crystal layer. At the same time, arsine ($AsH3$) and phosphine ($PH3$) are used as an example of the arsenic-based material and an example of the phosphorus-based material, respectively. Furthermore, dimethyl zinc (DMZ) or cyclopentadienyl magnesium ($Cp_2Mg$), hydrogen selenide ($H_2Se$), silane ($SiH_4$) gas, etc. are simultaneously introduced as doping materials.

The surface temperature of the substrate is measured by a radiation thermometer calibrated by an eutectic temperature of silicon and aluminum in each embodiment.

(First Embodiment)

FIG. 1 is a schematic sectional view of a chemical vapor deposition apparatus used to execute the producing method in each embodiment of the present invention. The apparatus is provided with a reaction container 1 made of quartz and a carbon susceptor 3 set in the reaction container 1. The reaction container 1 has a gas inlet 4 at an upper part thereof and a gas outlet 5 at a lower part thereof. A high frequency coil 6 is disposed outside the reaction container 1 so as to surround the susceptor 3.

In the chemical vapor deposition apparatus, the GaAs substrate 11 is held on the susceptor 3. The inside of the reaction container 1 is placed in a desired atmospheric condition by letting a predetermined amount of gas in and out of the reaction container through the gas inlet 4 and the gas outlet 5, respectively. When a high frequency current is applied to the high frequency coil 6, the susceptor 3 is heated by an induced current, so that the temperature of the GaAs substrate 11 is raised. The temperature of the GaAs substrate 11 is measured by a thermocouple 7 fitted to the susceptor 3, and controlled by a controller (not shown).

Figure 3:
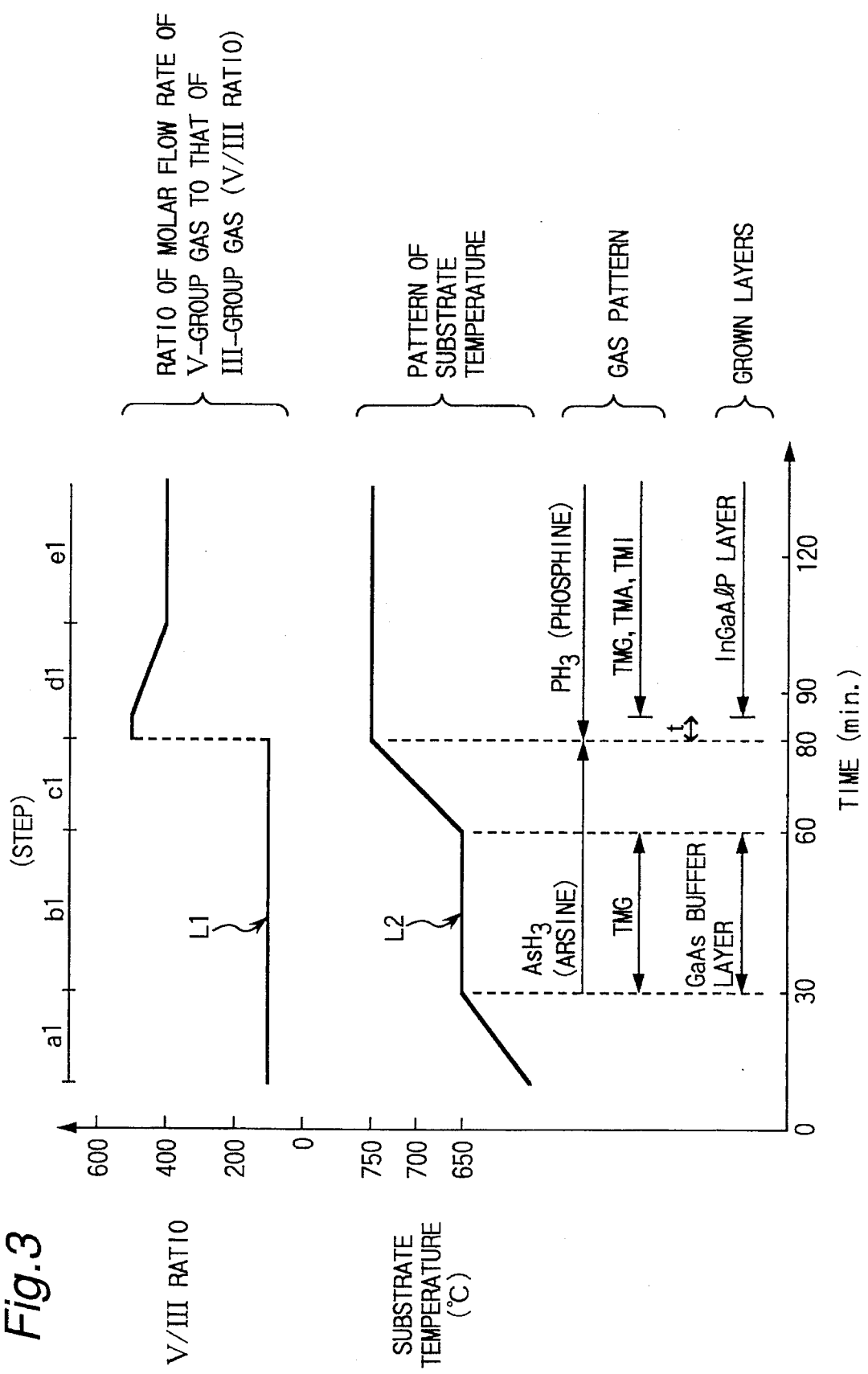
FIG. 3 is a diagram explanatory of a producing process along a time axis in a first embodiment of the present invention.

FIG. 3 indicates how each of control factors changes along a time axis in the first embodiment. L1 in FIG. 3 represents a ratio pattern showing the change with time of the ratio of the flow rate of a V-group element gas to that of a III-group element gas, and L2 indicates a substrate temperature pattern showing the change with time of the temperature of the substrate. Below the substrate temperature pattern L2 is a gas pattern showing kinds of gases to be fed into the reaction container 1. Moreover, kinds of grown layers formed at predetermined time points are shown below the gas pattern. TMG, TMA and TMI in the gas pattern are trimethyl gallium, trimethyl aluminum and trimethyl indium. $AsH_3$ is arsine and $PH_3$ is phosphine.

The first embodiment will be described with reference to FIG. 3.

After the GaAs substrate 11 is set in the reaction container 1, the pressure in the reaction container 1 is reduced to 10–100 torr, and arsine ($AsH_3$) is supplied through the gas inlet 4.

The high frequency coil 6 is made conductive to heat the substrate 11. The temperature of the substrate 11 is raised to 650° C. as shown in a step a1 of FIG. 3. The target temperature at this time is 600°–680° C. The substrate 11 may be maintained at the above temperature (650° C.) for approximately 30 min. to be purified.

In a next step b1, TMG is introduced into the reaction container 1 to grow the $Al_xGa_{1-x}As$ buffer layer 12 ($0≦x≦1$) on the substrate 11. In the instant embodiment, the buffer layer 12 is a GaAs buffer layer. The ratio of the molar flow rate of the V-group gas ($AsH_3$) to that of the III-group gas (TMG) is near 100.

The process advancing to step c1, the substrate 11 is raised to 750° C. The target temperature at this time is 720°–800° C. The ratio of the molar flow rate of the V-group gas ($AsH_3$) to that of the III-group gas (TMG) in the step c1 is approximately 100. Simultaneously with the finish of the step c1, the supply of $AsH_3$ (arsine) is stopped.

The process advancing to a step d1, $PH_3$ (phosphine) instead of $AsH_3$ (arsine) sent into the reaction container 1. Approximately 1 sec. after the process enters the step d1, TMG, TMA and TMI are started to be fed into the container 1. In the step d1, the ratio of the molar flow rate of the V-group gas (phosphine) to that of the III-group gas (TMG+ TMA+TMI) ($Q_V/Q_{III}$ ratio, referred to simply as V/III ratio) is set to be about 500 for the first 1 sec. Thereafter, the ratio (V/III ratio) of the molar flow rate of the V-group gas (phosphine) to that of the III-group gas (TMG+TMA+TMI) is lowered to 400. The V/III ratio is maintained at 400 in a succeeding step e1.

As described above, in the first embodiment, when the $In_y(Ga_{1-x}Al_x)_{1-y}P$ layer ($0≦x≦1$, $0≦y≦1$) (referred to as "InGaAlP layer") starts to grow, the ratio of the molar flow rate of the V-group element gas to that of the III-group element gas is set at 500. In other words, the V/III ratio assumes a value of 500, which is the largest in the whole producing process, for 1 sec. after the step d1 starts (namely, 1 sec. immediately before the InGaAlP layer 13 of a high Al composition is grown).

Since the concentration of P in the step d1 is raised higher than that in the remaining step e1 immediately before the InGaAlP layer 13 starts to grow, the separation of P (phosphorus), which would otherwise easily take place in the vicinity of a heterointerface between the GaAs buffer layer 12 and InGaAlP layer 13, is suppressed. Accordingly, in comparison with a case where the V/III ratio is not increased immediately before the start of the growth, crystal defects resulting from the above separation of P (phosphorus) are greatly limited in the InGaAlP layer 13, whereby the InGaAlP layer 13 formed is of good quality. The V/III ratio immediately before the InGaAlP layer 13 starts to grow is preferably 500 or higher, and may be 600.

The V/III ratio is gradually decreased immediately after the InGaAlP layer 13 starts to grow. Then the process enters the step e1, in which the V/III ratio is stabilized at 400. Preferably, the V/III ratio at this time is of a value of 500 or smaller which is optimum to grow the InGaAlP layer 13. Since the V/III ratio is set at 400 which is not larger than 500, it is possible to grow an InGaAlP layer 13 with good crystal properties.

Figure 4:
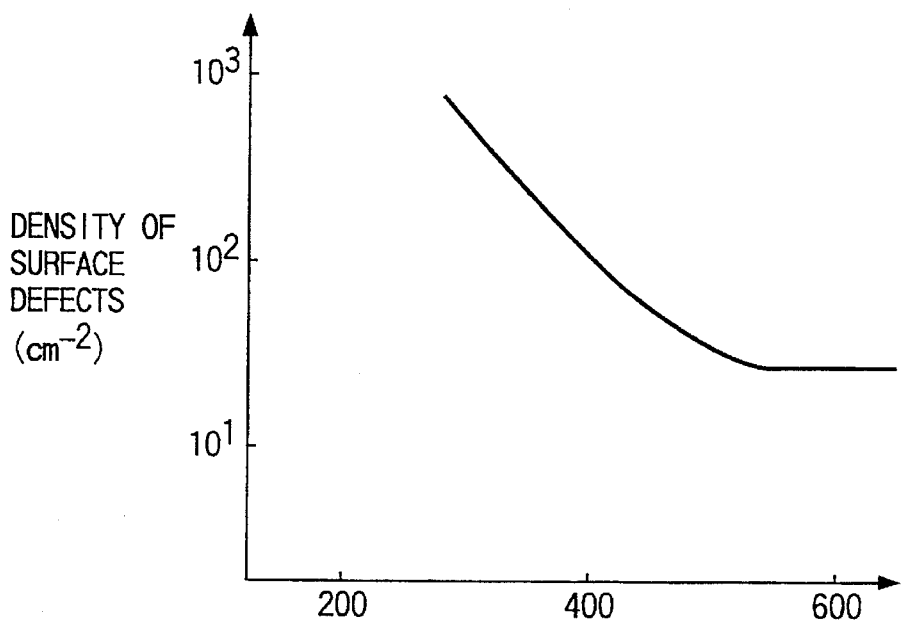
FIG. 4 is a graph showing a relation between the V/III ratio and the density of surface defects at the growing start of an InGaAlP layer in a step d1 in the first embodiment.

In FIG. 4 is shown a relation between the V/III ratio and the density ($cm^{-2}$) of surface defects on the InGaAlP layer 13 in a time t preceding the start of growth of the InGaAlP layer 13 in the step d1 in the first embodiment. As is obvious from FIG. 4, in the first embodiment, the density of surface defects ($cm^{-2}$) becomes lower than $10^2 cm^{-2}$ because of the V/III ratio of 500 at the start of the growth of the InGaAlP layer 13. In contrast, the density of surface defects could not be $10^2 cm^{-2}$ or lower in the prior art. When the V/III ratio exceeds 500, the density of surface defects is decreased at an extremely low rate. When the V/III ratio exceeds 550, the density of surface defects hardly represents a decrease.

Figure 5:
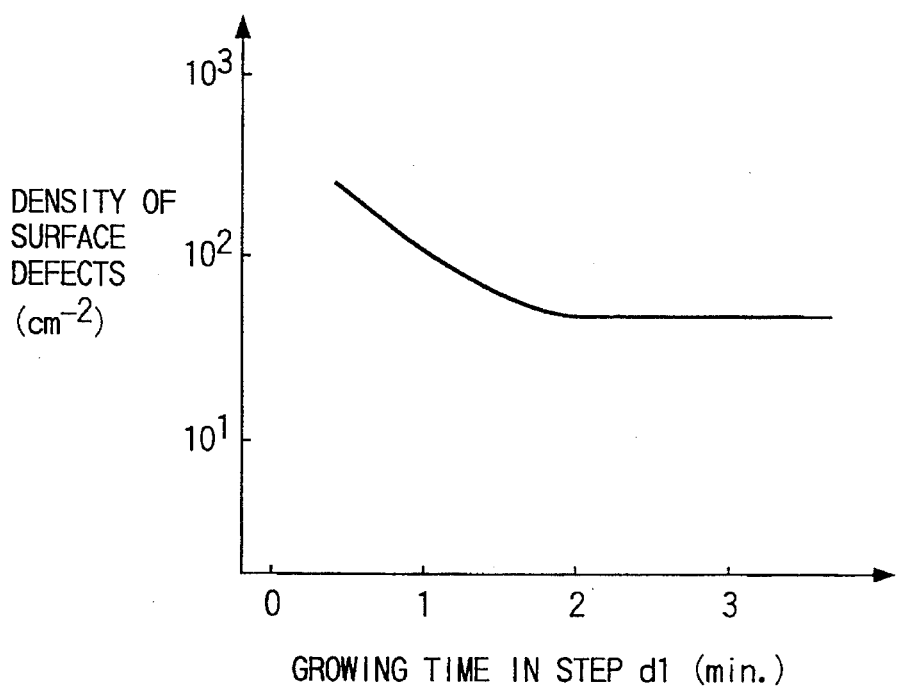
FIG. 5 is a graph showing a relation between the time and the density of surface defects in the step d1 in the first embodiment.

FIG. 5 is a graph showing a relation between the density of surface defects and the time Td taken to reduce the V/III ratio from the maximum 500 to the stable value of 400 in the step d1 of the first embodiment. As shown in FIG. 5, if the time Td is 1.1 min. or longer, the density of surface defects is not larger than $10^2$ ($cm^{-2}$). Since the time Td is set at 2 min. in the step d1 of the first embodiment, the density of surface defects was surely not larger than $10^2$ $cm^{-2}$. That is, crystal defects caused by the separation of P (phosphorus) which is apt to happen in the vicinity of the heterointerface between the GaAs buffer layer 12 and InGaAlP layer 13 are remarkably reduced according to the first embodiment. The density of surface defects is hardly lowered any further if the time Td is over 2 min.

Figure 6:
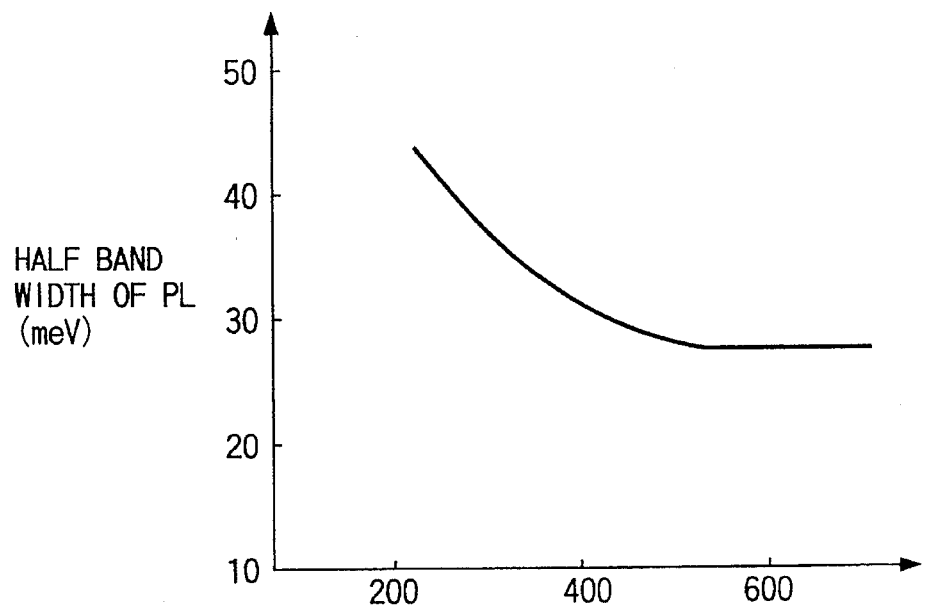
FIG. 6 is a graph showing a relation between the V/III ratio and the half width of PL (photoluminescence) at the growing start of the InGaAlP layer in the step d1 in the first embodiment.

FIG. 6 is a graph showing a relation between the half band width of PL (photoluminescence) and the V/III ratio to be employed during the time between switching of the V-group material gas and the growth start of the InGaAlP layer 13 in the step d1 of the first embodiment. From FIG. 6, it is understood that the half width of PL can be made lower than 30 meV if the V/III ratio immediately before the InGaAlP layer 13 starts to grow and when the layer 13 starts to grow is 500 or larger. Because the V/III ratio was set at 500 in the first embodiment, the half band width of PL was accordingly smaller than 30 meV. In contrast to this, the half width of PL could not be 30 meV or smaller in the prior art.

Figure 7:
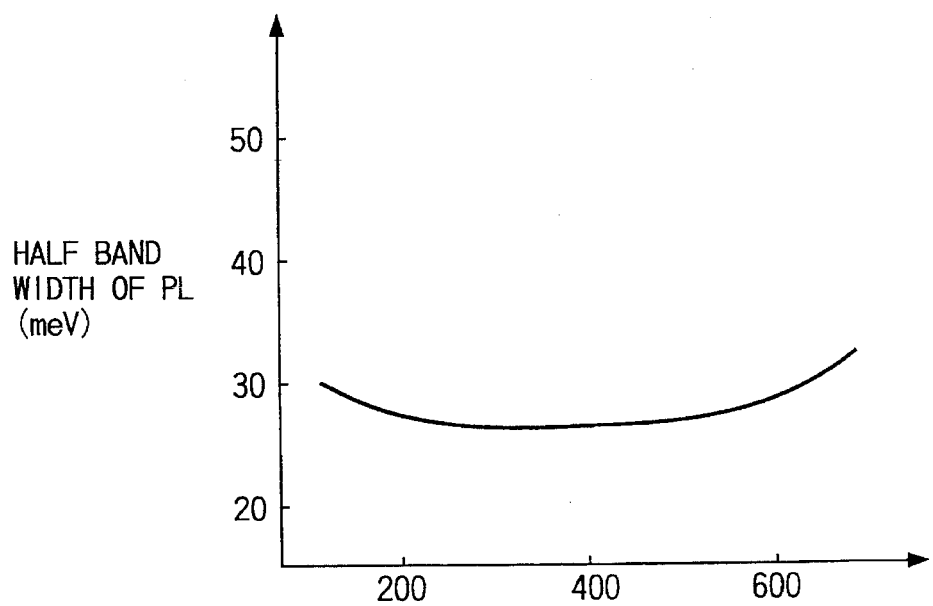
FIG. 7 is a graph showing a relation of the V/III ratio to the half width of PL in a step e1 of the first embodiment.

A relation between the V/III ratio in the step e1 and the half band width of PL is indicated in FIG. 7. As is apparent from FIG. 7, if the V/III ratio in the step e1 is set within the range of 150–620, the half band width of PL is reduced to 30 meV or smaller. In the first embodiment, the half width of PL was smaller than 30 meV because of the V/III ratio of 400.

As is evident from FIGS. 4–7, the first embodiment produces a good crystalline layer of InGaAlP 13 and improves the characteristics thereof.

Figure 2A:
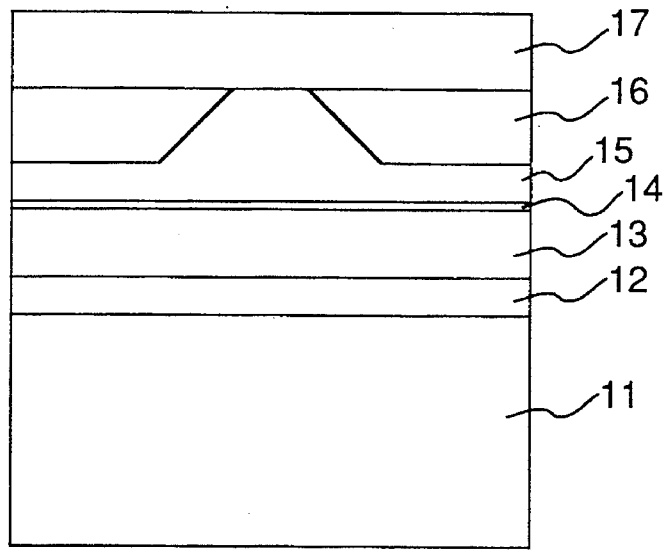
Figure 2B:
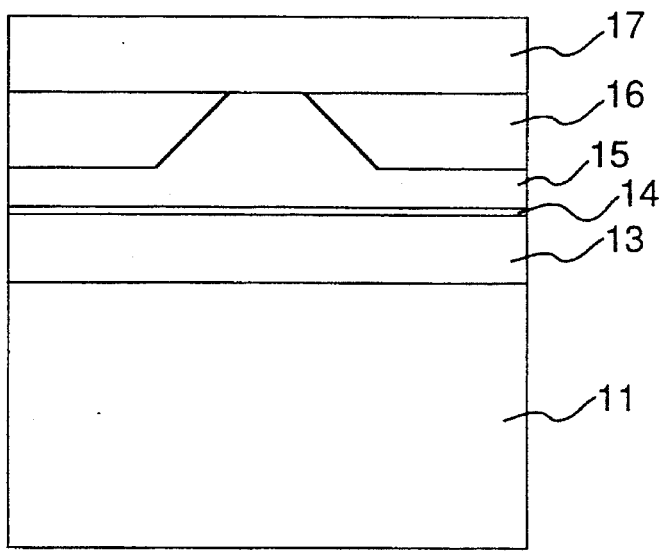

An InGaAlP semiconductor laser device of the structure of FIG. 2(A) including crystalline layers of compound semiconductor, i.e., the n-GaAs substrate 11, n-GaAs buffer layer 12 and n-InGaAlP clad layer 13 produced according to the first embodiment operated stably for 10,000 hours or more at an ambience temperature of 50° C. with an optical output of 40 mW. This proves that the method of the first embodiment is surely effective in producing good quality crystalline layers of compound semiconductor with superior characteristics.

(Second Embodiment)

Figure 8:
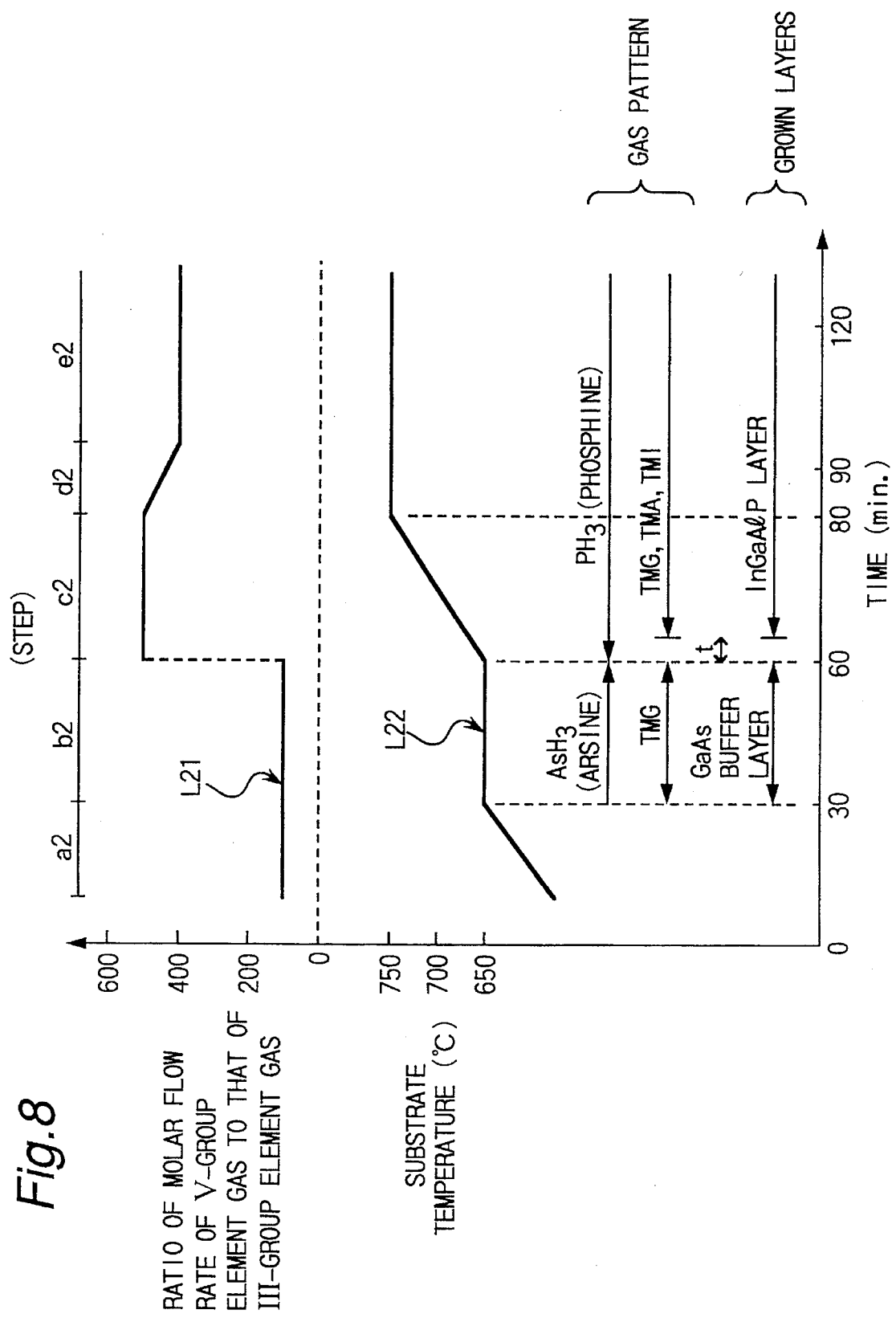
FIG. 8 is a diagram of a producing process along a time axis in a second embodiment.

FIG. 8 shows the change of each parameter along a time axis in a second embodiment of the present invention, in which L21 represents the change with time of the ratio of the molar flow rate of the V-group element gas to that of the III-group element gas (V/III ratio), and L22 represents the change with time of the temperature of the substrate. A material introduction pattern and grown layers are indicated below the pattern L22. A producing process in accordance with the second embodiment will be described with reference to FIG. 8.

The reaction container 1 is reduced to 10–100 torr with the GaAs substrate 11 set therein, and arsine is introduced through the gas inlet 4.

In a step a2, by energizing the high frequency coil 6 and thereby heating the substrate 11 the temperature of the substrate 11 is raised up to 650° C. by the end of the step a2. The raised temperature should be in a range of 600°–680° C. The substrate 11 may be purified by holding the substrate 11 at the raised temperature (650° C.) for about 30 min.

The process advancing to a step b2, TMG is fed into the reaction container 1, whereby the $Al_xGa_{1-x}As$ buffer layer 12 ($0 \leq x \leq 1$) is formed on the substrate 11. In this embodiment, the buffer layer 12 is a GaAs buffer layer. Subsequently, the supply of TMG is stopped thereby to stop the growth of the GaAs buffer layer 12. The ratio (V/III ratio) of the molar flow rate of the V-group gas ($AsH_3$) to that of the III-group gas (TMG) is approximately 100 in the step b2.

The process advances to a next step c2, wherein the gas to be supplied to the reaction container 1 is changed from arsine to phosphine. Five seconds (t=5 sec.) after the change of the gas, TMA, TMG and TMI preliminarily adjusted at a predetermined mixing ratio are introduced into the reaction container 1, to start the formation of the InGaAlP layer 13. The mixed gas is not necessarily introduced 5 seconds later (t=5 sec.), but may be introduced 0–15 seconds later (t=0–15 sec.).

The process reaching the step c2, the V/III ratio is increased from approximately 100 to approximately 500. The V/III ratio is maintained at approximately 500 during the step c2. The temperature of the substrate is continuously raised during the step c2 to reach 750° C. at the end of the step c2. The substrate temperature at the end of the step c2 should be set in the range of 720°–800° C.

The process then proceeds to the next step c2, in which the V/III ratio is decreased from approximately 500. The V/III ratio at the end of the step d2 is rendered 400.

Next, the process advances to a step e2, in which the V/III ratio is kept constant, namely, at approximately 400.

According to the second embodiment as above, since the substrate temperature is 745°–755° C. in the steps e2 and d2, a temperature condition to grow a good InGaAlP layer 13 is satisfied.

In the meantime, the gas is switched from arsine to phosphine at the start of the step c2. Since the temperature of the substrate when the gas is switched is 650° C., the GaAs buffer layer 12 is prevented from being rapidly decomposed. Therefore, it is possible to prolong the gas replacement time t without causing decomposition of the GaAs buffer layer 12. Thus, arsine ($AsH_3$) is sufficiently replaced with phosphine ($PH_3$). Accordingly, As is prevented from being included into the InGaAlP layer 13. Moreover, separation of P (phosphorus) from the InGaAlP layer 113 is suppressed.

In the second embodiment, similar to the first embodiment, since the V/III ratio is set at 500 at the start of the step c2, crystal defects resulting from the separation of P (phosphorus) can be much decreased. Moreover, since the V/III ratio is lowered to 400 in the following step d2, a good crystal is formed.

As is described hereinabove, both the V/III ratio and the temperature of the substrate are controlled in the method of the second embodiment, so that this method can produce crystalline layers of compound semiconductor including an InGaAlP layer of a high Al composition showing improved crystallinity.

Figure 9:
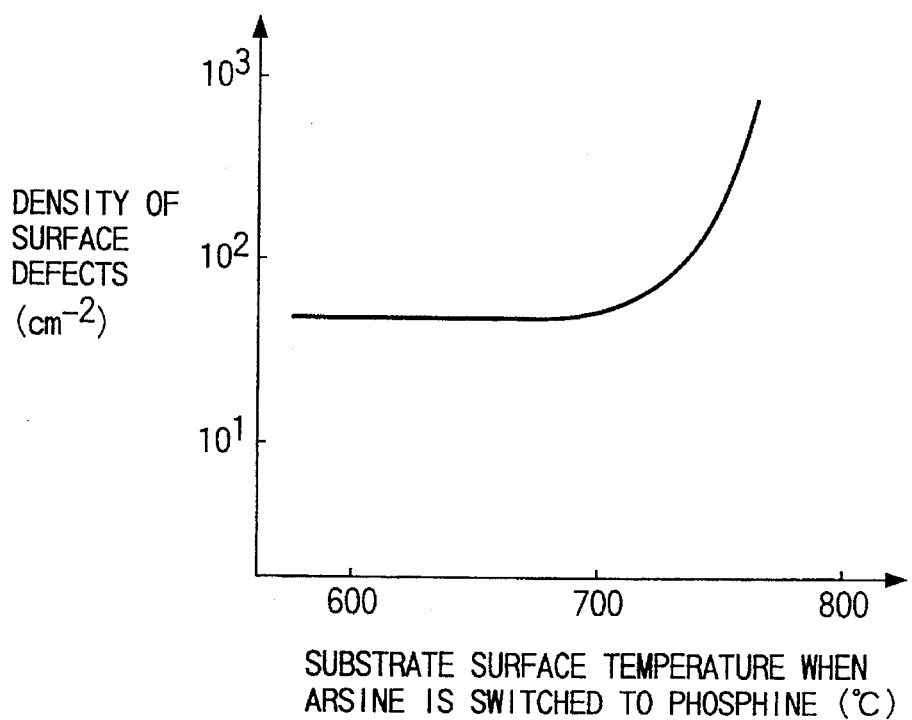
FIG. 9 is a graph showing a relation between the surface temperature of a substrate and the density of surface defects when arsine is exchanged with phosphine in the second embodiment.

In FIG. 9, it is shown how the density of surface defects of the InGaAlP layer changes in accordance with the change of the substrate temperature at which the step b2 is switched to the step c2 (that is, the gas is switched from arsine to phosphine). When the substrate temperature is 720° C. or lower, the density of surface defects is reduced to $10^2$ cm$^{-2}$ or lower, as is apparent from FIG. 9.

Figure 10:
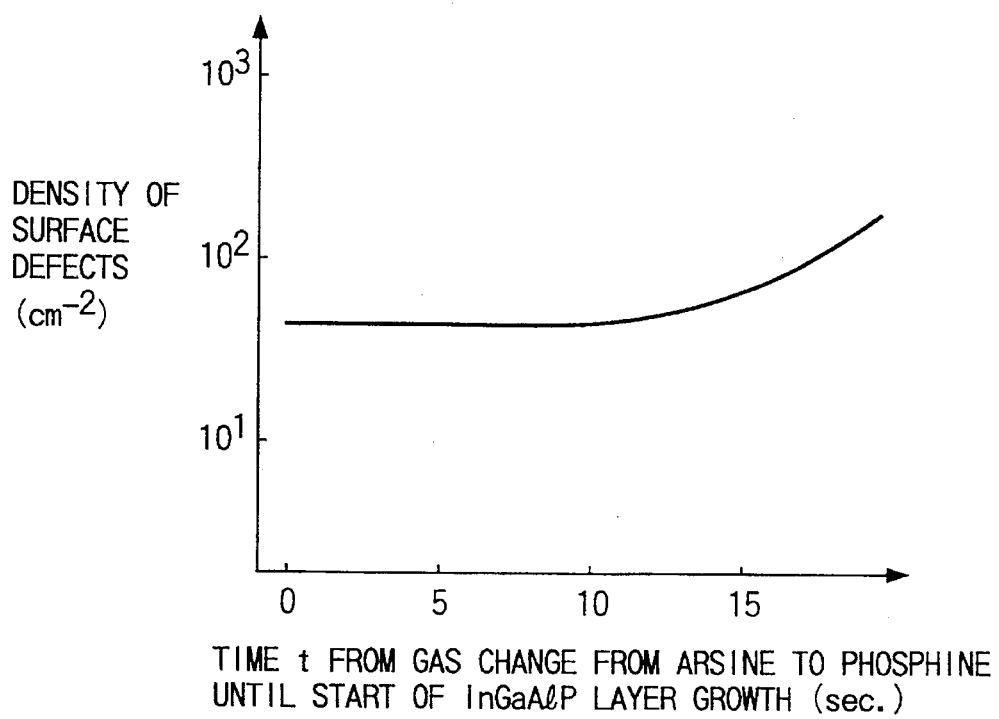
FIG. 10 is a graph showing a relation between the time and the density of surface defects before an InGaAlP layer is grown after arsine is switched to phosphine.

FIG. 10 shows how the density of surface defects of the InGaAlP layer changes with the change of the time interval t between the gas switching from arsine to phosphine and the growth start of the InGaAlP layer. As is evident from FIG. 10, if the time t is not longer than 15 sec. and not shorter than 0 sec., the density of surface defects is made smaller than $10^2$ cm$^{-2}$.

Figure 11:
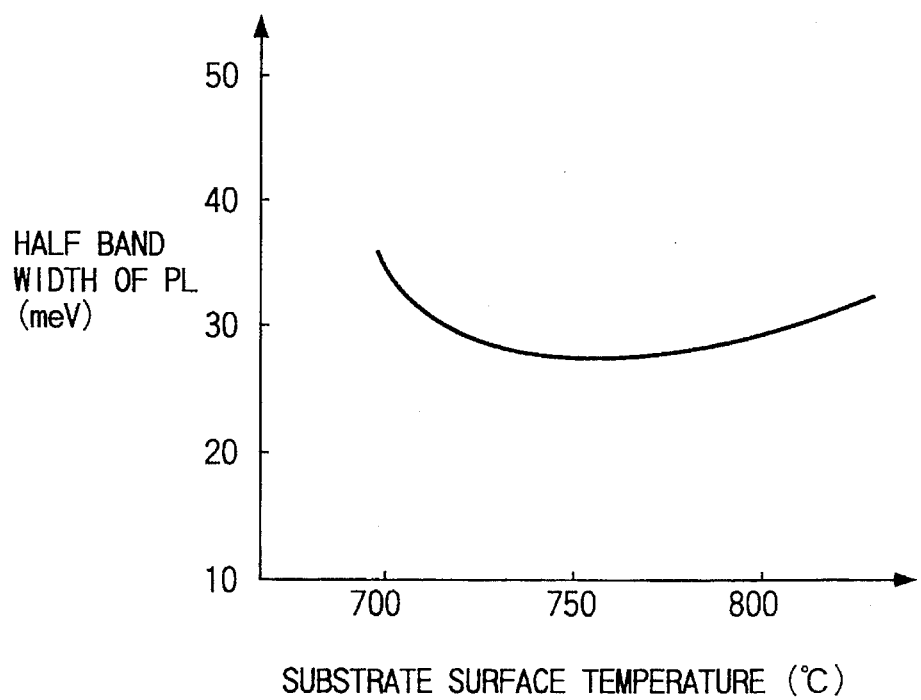
FIG. 11 is a graph showing a relation between the surface temperature of a GaAs substrate and the half width of PL (photoluminescence) in a step c of the second embodiment.

FIG. 11 indicates the change of the half band width of PL (photoluminescence) when the surface temperature of the substrate, namely, temperature of the InGaAlP layer is changed in the step c2. When the surface temperature of the substrate is set at 720°–800° C. in the step c2, the half width of PL is reduced to 30 meV or smaller.

Figure 12:
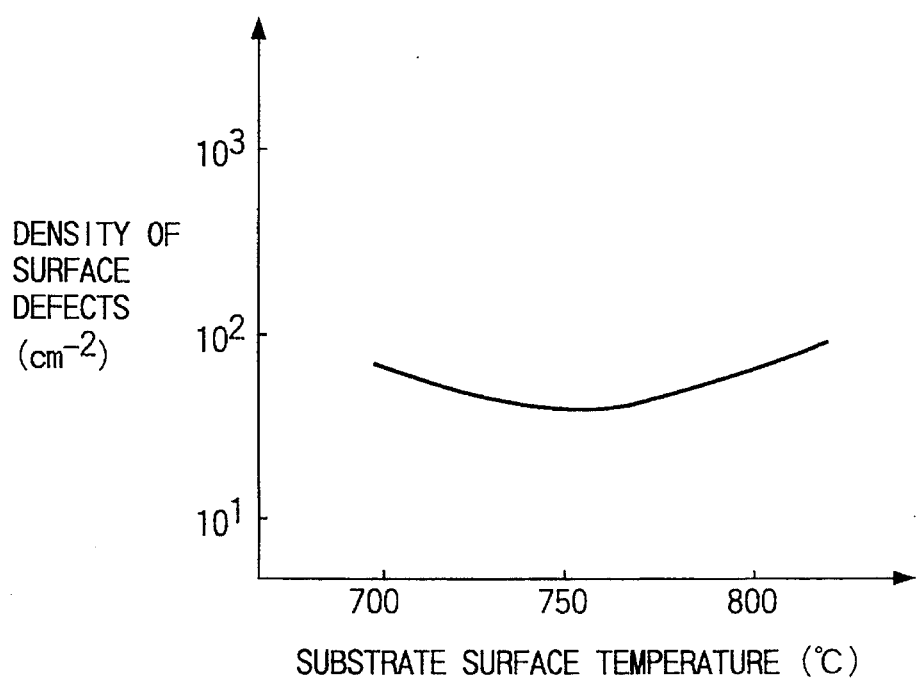
FIG. 12 is a graph of a relationship between the surface temperature of the GaAs substrate and the density of surface defects in the step c of the second embodiment.

Further, FIG. 12 shows the change of the density of surface defects in the InGaAlP layer when the surface temperature of the substrate is changed in the step c2. As is apparent from FIG. 12, a surface temperature in the range of 700°–800° C. can decrease the density of surface defects to $10^2$ cm$^{-2}$ or lower.

As is understood from the characteristics shown in FIGS. 9–12, the second embodiment produces, as compared with the prior art, crystal layers of compound semiconductor with less crystal defects and superior luminescent properties. Moreover, a semiconductor laser device of an InGaAlP series in the laminate structure of FIG. 2(A) manufactured with the use of the compound semiconductor crystal layer of the second embodiment operated stably for 10,000 hours or longer at 50° C. with an optical output of 50 mW. This proves that the producing method of the second embodiment makes it possible to obtain InGaAlP layers of better crystal properties than in the prior art.

(Third Embodiment)

Figure 13:
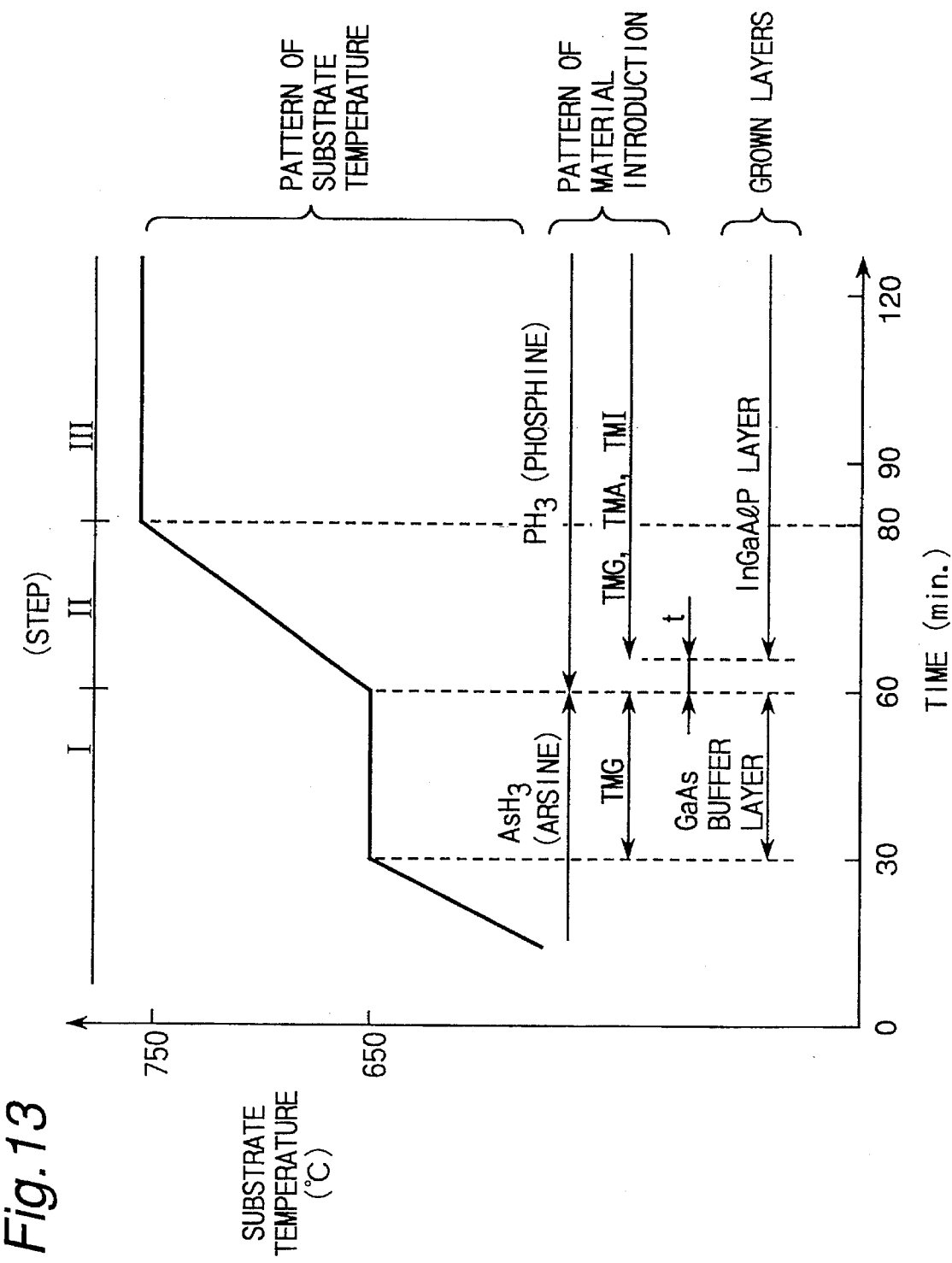
FIG. 13 is a diagram of a producing process along a time axis in a third embodiment of the present invention.

A diagram of FIG. 13 schematically shows a temperature pattern of the surface of a GaAs substrate, an introduction pattern of materials, and grown layers when a semiconductor laser is to be manufactured in accordance with a producing method of the first embodiment.

The GaAs substrate 11 is put in the reaction container 1 (FIG. 1) and then, the pressure inside of the reaction container 1 is reduced to 10–100 torr. Arsine is introduced into the reaction container. The temperature of the GaAs substrate 11 is set approximately at 650° C. (preferably 600°–680° C.) by heating the substrate 11. When necessary, the surface temperature of the GaAs substrate 11 is kept at 650° C. for 30 min. to purify the GaAs substrate 11. Subsequently, TMG is introduced to form then an Al$_x$Ga$_{1-x}$As buffer layer (0≦x≦1) 12, for example, a GaAs buffer layer, on the GaAs substrate 11. TMG is then stopped so that the growth of the GaAs buffer layer 12 is stopped (step I in FIG. 13).

The supply of arsine is stopped and then phosphine is introduced. Five seconds (t=5 sec., preferably 0–15 sec.) later, TMA, TMG and TMI adjusted at a predetermined mixing ratio beforehand are fed into the container to start the formation of the InGaAlP layer. While the InGaAlP layer is let to grow, the GaAs substrate is raised to about 750° C. (desirably 720°–800° C.) which is a temperature to obtain good crystals (step II in FIG. 13).

In the state where the surface temperature of the GaAs substrate 11 is stabilized at substantially 750° C., the InGaAlP layer 13 is grown to a predetermined thickness (step III in FIG. 13).

Figure 14:
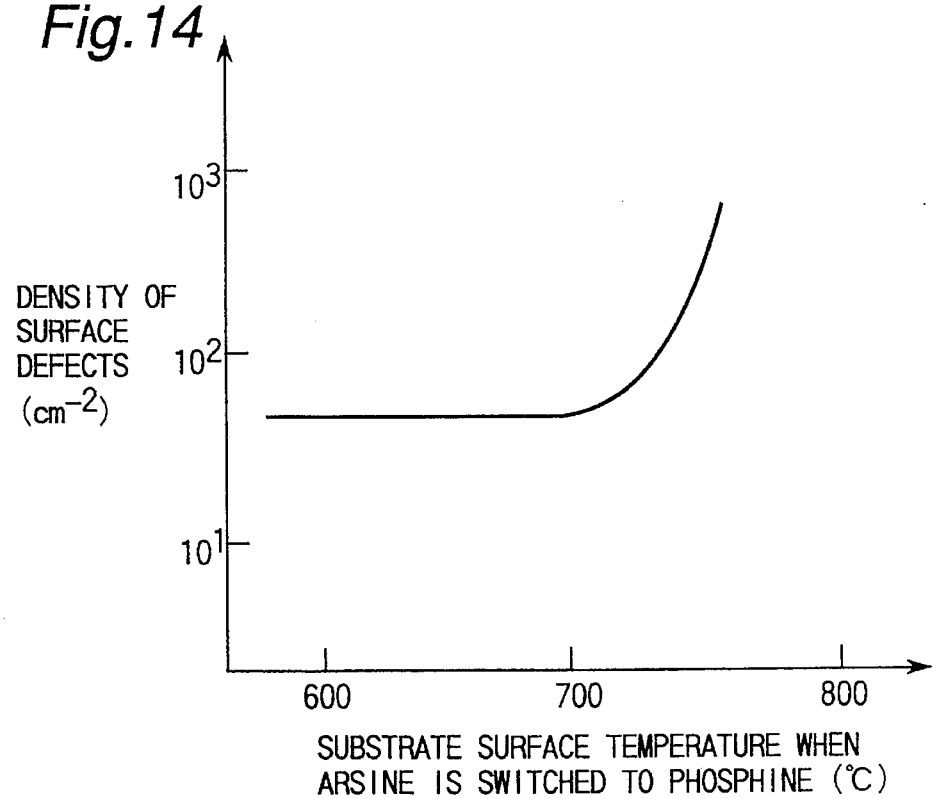
FIG. 14 is a graph showing a relation between the surface temperature of a GaAs substrate and the density of surface defects when arsine is exchanged with phosphine in the second embodiment.

FIG. 14 illustrates a relation of the density of surface defects to the surface temperature of the GaAs substrate at which arsine is changed to phosphine in the embodiment. Although the density of surface defects could not be lower than $10^2$ cm$^{-2}$ in the producing method of the prior art of FIG. 32. In contrast, as is apparent from FIG. 14 which indicates that the density of surface defects is $10^2$ cm$^{-2}$ or smaller when the surface temperature of the GaAs substrate is 720° C. or lower, the embodiment achieves a reduced density of surface defects by setting the surface temperature of the GaAs substrate at 720° C. or lower when arsine is switched to phosphine in the step II.

Figure 15:
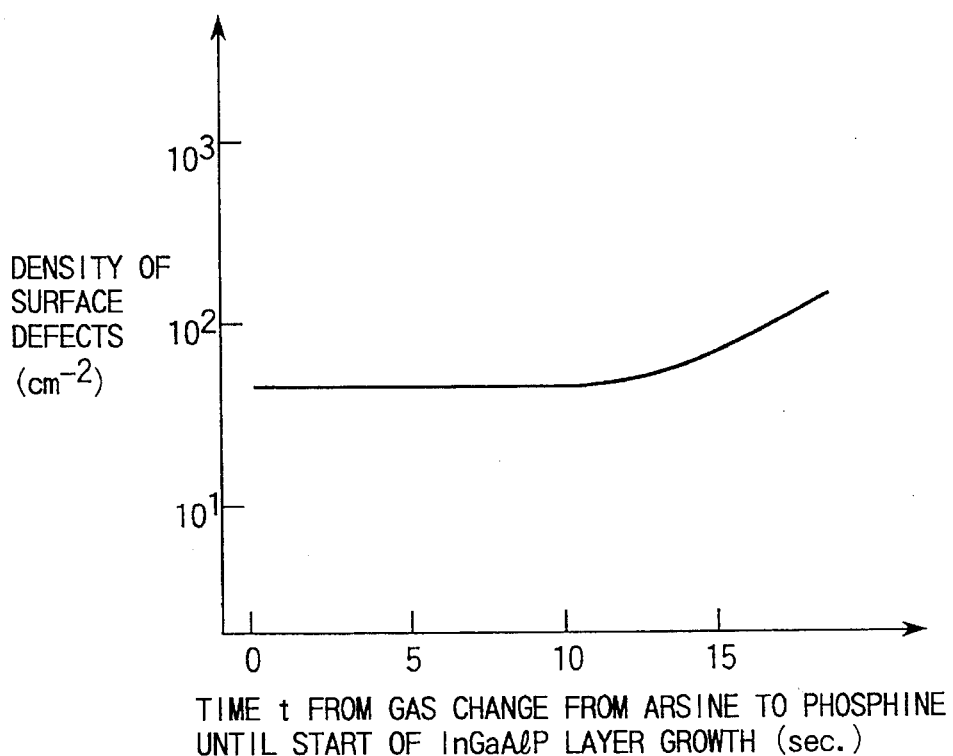
FIG. 15 is a graph showing a relation between the time and the density of surface defects before an InGaAlP layer is grown after arsine is switched to phosphine.

FIG. 15 illustrates a relation between the density of surface defects to the time period t before the InGaAlP layer starts to grow after arsine is switched to phosphine in the third embodiment. If the surface temperature of the GaAs substrate is 750° C. when arsine is switched to phosphine, the density of surface defects cannot be rendered lower than $10^2$ cm$^{-2}$. On the other hand, in a case where the surface temperature of the GaAs substrate is set at 650° C. when arsine is switched to phosphine, as is clearly shown in FIG. 15, the density of surface defects is reduced to $10^2$ cm$^{-2}$ or lower when the time t is not longer than 15 sec. Therefore, the time t from the gas change from arsine to phosphine until the start of the InGaAlP layer growth in the step II is desirably 0–15 sec. More preferably, the time t is 1–15 sec. in order to sufficiently replace arsine with phosphine. Since switching arsine to phosphine at low 650° C. prevents the GaAs buffer layer 12 from being quickly decomposed, the time t after arsine is switched to phosphine before the InGaAlP layer 13 starts to grow is set at as long as 5 sec. or so in the first embodiment. Consequently, the ambience in the reaction container is sufficiently changed from arsine to phosphine, so that inclusion of As into the InGaAlP layer is prevented.

Figure 16:
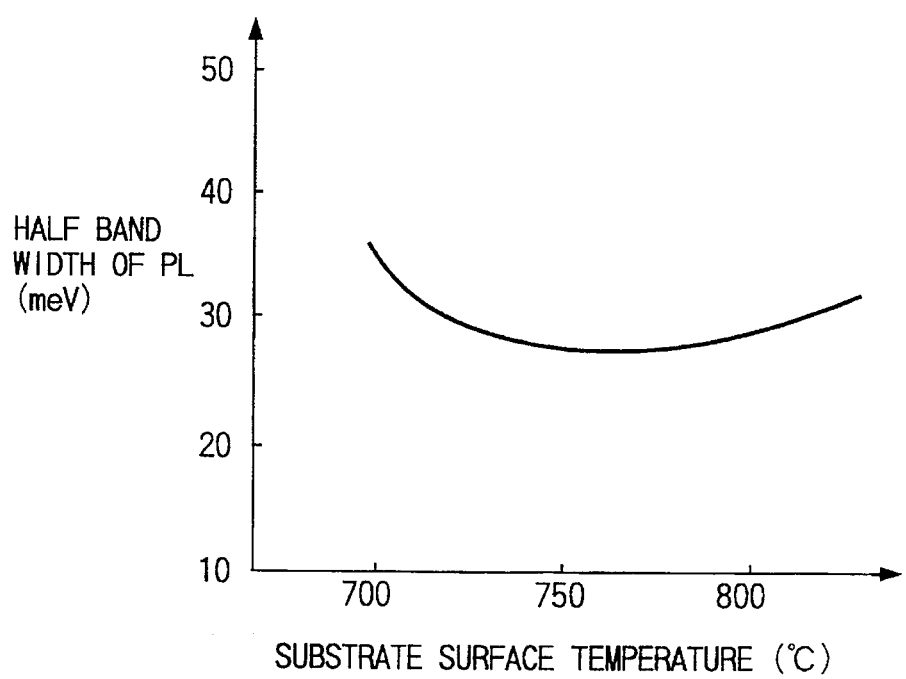
FIG. 16 is a graph showing a relation between the surface temperature of the GaAs substrate and the half width of PL in a step III in the third embodiment.
Figure 17:
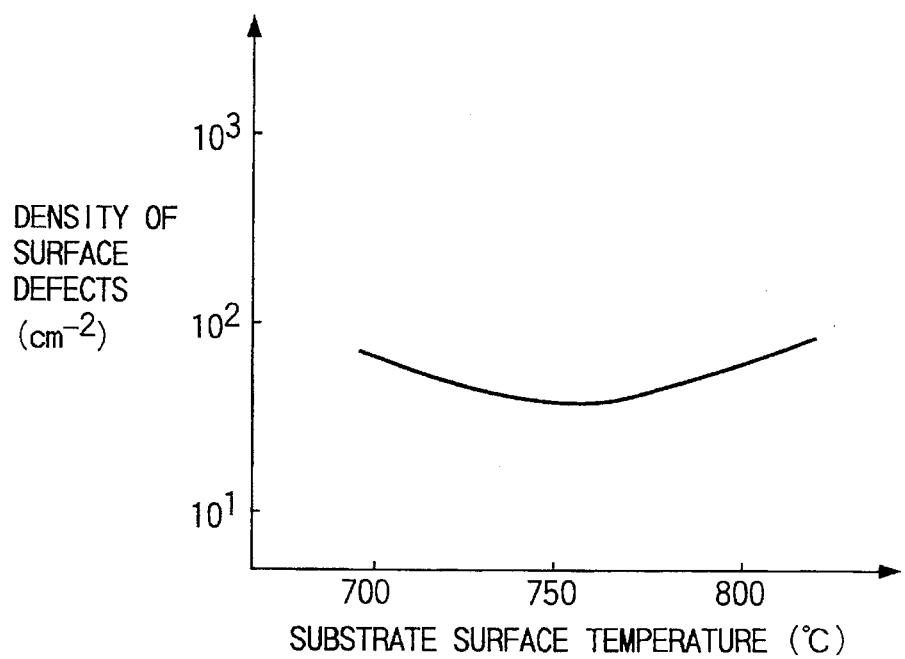
FIG. 17 is a graph of a relation between the surface temperature of the GaAs substrate and the density of surface defects in the step III in the third embodiment.

FIG. 16 shows a relation of the half width of PL (photoluminescence) of the InGaAlP layer formed in the step III to the surface temperature of the GaAs substrate. According to the producing method of the prior art in FIG. 32, the half width of PL could not be 30 meV or smaller. In this embodiment of the present invention, the half width of PL was reduced to 30 meV or lower when the surface temperature of the GaAs substrate was 720°–800° C., as shown in FIG. 16. FIG. 17 is a graph showing the density of surface defects of the InGaAlP layer grown in the step III to the surface temperature of the GaAs substrate. In comparison with the prior art producing method of FIG. 32 wherein the density of surface defects could not be lower than $10^2$ cm$^{-2}$, the instant embodiment could decrease the density of surface defects to a value of the order of $10^1$ cm$^{-2}$ when the surface temperature of the GaAs substrate was 700°–800° C. as is shown in FIG. 17.

In the step II, since arsine is replaced with phosphine at a low surface temperature within 600°–680° C. of the GaAs substrate, the GaAs buffer layer is prevented from rapidly decomposing. Moreover, owing to the prevention of the GaAs buffer layer from its rapid decomposition, the time t for replacement of arsine with phosphine is sufficiently taken, thereby avoiding the inclusion of As to the InGaAlP layer. The initial growth of the InGaAlP layer 13 is started when the surface temperature of the GaAs substrate is as low as 600°–680° C., the separation of P (phosphorus) prone to occur at the InGaAlP layer 13 in the vicinity of the heterointerface with the GaAs buffer layer 12 is prevented. Thus, crystal defects in the InGaAlP layer 13 in the vicinity of the heterointerface with the GaAs buffer layer are decreased, and a good heterointerface is obtained.

When an InGaAlP semiconductor laser device having the structure of FIG. 2(A) was manufactured according to the method of the embodiment, the device demonstrated a stable operation for 10,000 hours or longer at 50° C. with an optical output of 40 mW. Therefore, the producing method of the invention realizes a semiconductor laser of a short wavelength with enhanced characteristics and high reliability.
(Fourth Embodiment)

Figure 18:
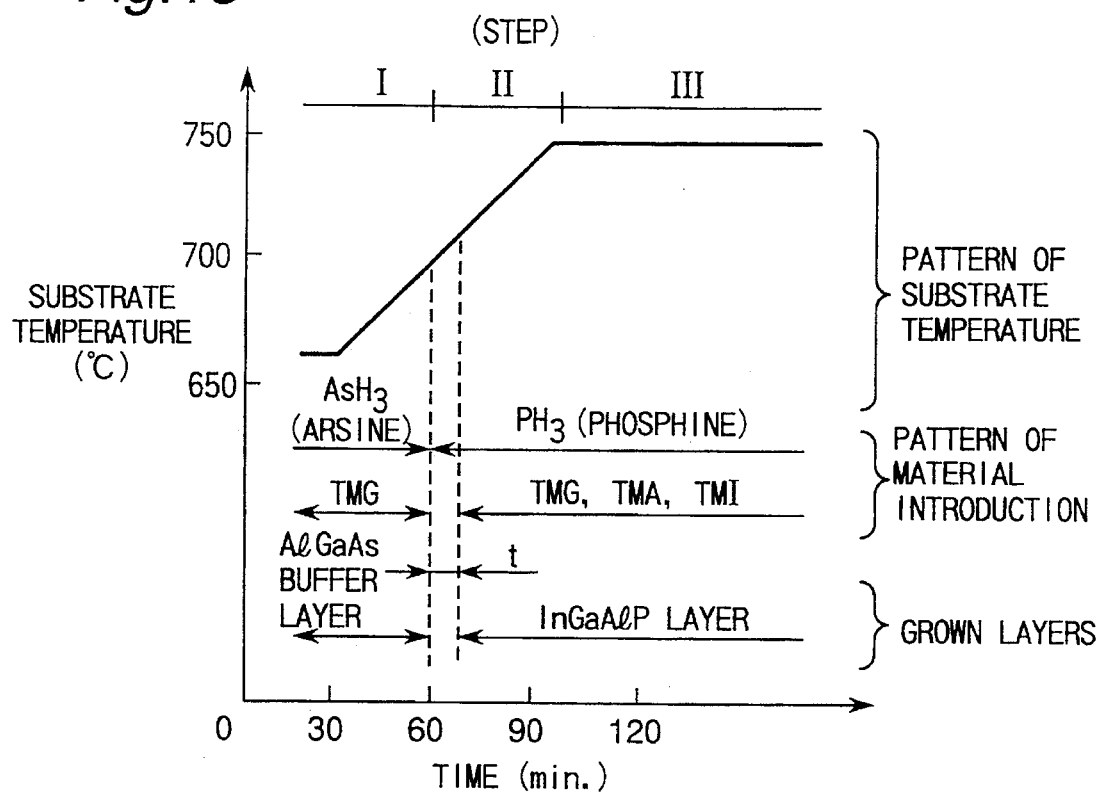
FIG. 18 is a diagram of a producing process along a time axis in a fourth embodiment of the present invention.

FIG. 18 is a schematic diagram of a temperature pattern of the surface of a GaAs substrate, an introduction pattern of materials and grown layers when a semiconductor laser is to be manufactured with the use of a producing method according to a fourth embodiment of the present invention.

The producing method of the fourth embodiment will now be described with reference to FIG. 18.

The GaAs substrate 11 is placed in the reaction container 1 (FIG. 1). The pressure in the reaction container 1 is reduced to 10–100 torr and arsine is introduced into the container. The GaAs substrate 11 is heated such that the surface temperature thereof is raised from approximately 650° C. (desirably 600°–680° C.) to approximately 700° C. (preferably 720° or lower). During this time, TMG and TMA are fed into the reaction container to grow the AlGaAs buffer layer 12 on the GaAs substrate 11 (step I of FIG. 18).

Thereafter, supply of TMG and TMA is stopped such that the growth of the AlGaAs buffer layer 12 is stopped, and then arsine is switched to phosphine. A time t later, TMA, TMG and TMI adjusted beforehand at a predetermined mixing ratio are fed to start the formation of the InGaAlP layer 13 on the AlGaAs buffer layer 12. While the InGaAlP layer 13 grows, the GaAs substrate 11 is heated to show the surface temperature of approximately 750° C. (preferably 720°–800° C.) whereat a good crystal is obtained (step II in FIG. 18).

The InGaAlP layer 13 is grown to a predetermined thickness with the surface temperature of the GaAs substrate 11 being kept at about 750° C. (step III in FIG. 18).

As described hereinabove, since arsine is switched to phosphine when the surface temperature of the GaAs substrate is low, namely, not higher than 720° C. in the step II, the AlGaAs layer 12 is prevented from quickly decomposing. Moreover, since the AlGaAs layer 12 is prevented from quickly decomposing as above, the time t for arsine to be switched to phosphine is secured long, so that As is prevented from being included in the InGaAlP layer 13 in the initial stage of its growth. Further, since the InGaAlP layer starts to grow initially at the low surface temperature of the GaAs substrate of 720° C. or lower, P (phosphorus) is prevented from being separated from the InGaAlP layer in the vicinity of the heterointerface with the AlGaAs buffer layer. Consequently, crystal defects of the InGaAlP layer 13 in the vicinity of its heterointerface with the AlGaAs buffer layer 12 are reduced, and a good heterointerface is obtained.

According to the above fourth embodiment, since the AlGaAs buffer layer 12 alike is grown while the surface temperature of the GaAs substrate 11 is being increased from as low as 650° C. up to 700° C., crystal defects of the AlGaAs buffer layer 12 are reduced, and crystal properties of the InGaAlP layer 13 formed on the AlGaAs buffer layer 12 are improved further.
(Fifth Embodiment)

Figure 19:
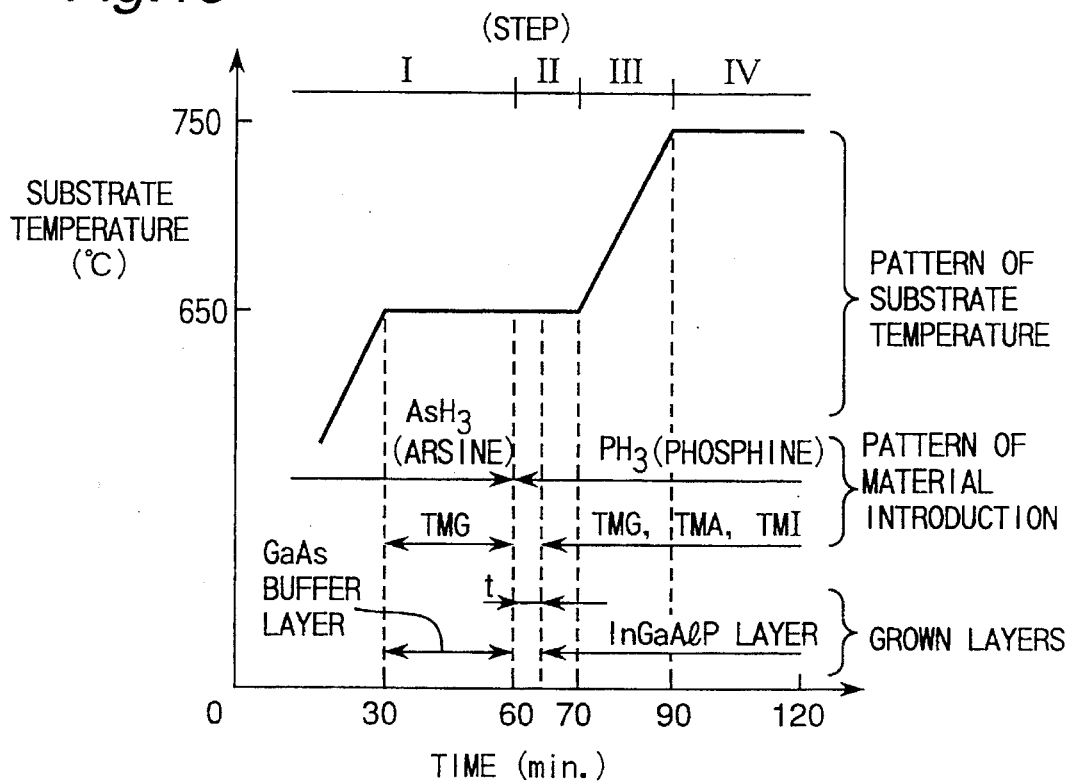
FIG. 19 is a diagram of a producing process along a time axis in a fifth embodiment of the present invention.

FIG. 19 is a schematic diagram of a temperature pattern of the surface of a GaAs substrate, an introduction pattern of materials and grown layers when a semiconductor laser is to be manufactured with a producing method of crystal layers of compound semiconductor according to a fifth embodiment of the present invention.

The producing method of the fifth embodiment of the invention will be described with reference to FIG. 19.

The GaAs substrate 11 is placed in the reaction container 1 (FIG. 1). The pressure in the reaction container 1 is reduced to 10–100 torr and arsine is introduced into the container. The GaAs substrate 11 is heated such that the surface temperature thereof is raised to approximately 650° C. (preferably 720° or lower). Then, TMG is fed into the reaction container to grow the GaAs buffer layer 12 on the GaAs substrate 11 (step I of FIG. 18). Thereafter, the supply of TMG is stopped to interrupt the formation of the GaAs buffer layer 12 (step I in FIG. 19).

Phosphine is then introduced instead of Arsine. A time t after the gas change, TMA, TMG and TMI adjusted at a predetermined mixing ratio beforehand are fed into the container to start the growth of the InGaAlP layer 13 on the GaAs buffer layer (step II in FIG. 19).

After a predetermined time has passed since the InGaAlP layer 13 started to grow, the surface temperature of the GaAs substrate 11 is raised to approximately 750° C. (favorably 720°–800° C.) to obtain a good crystal for the growing InGaAlP layer 13 (step III in FIG. 19).

With the surface temperature of the GaAs substrate 11 maintained at about 750° C., the InGaAlP layer 13 is grown to a predetermined thickness (step IV in FIG. 19).

Since arsine is switched to phosphine when the surface temperature of the GaAs substrate 11 is low 650° C. in the step II, the GaAs buffer layer 12 is prevented from rapidly decomposing. As the rapid decomposition of the GaAs buffer layer 12 is evitable, phosphine replaces arsine in the sufficient time t, thereby preventing inclusion of As into the InGaAlP layer. The GaAs buffer layer 12 is grown at as low as approximately 650° C. of the surface temperature of the GaAs substrate 11, and the InGaAlP layer 13 is initially started to grow at the same 650° C. or so of the surface temperature of the GaAs substrate. Therefore, the separation of P (phosphorus) liable to occur at the InGaAlP layer 13 in the vicinity of the heterointerface with the GaAs buffer layer 12 is avoided. As a result, crystal defects of the InGaAlP layer 13 in the initial growing stage are effectively decreased, so that a good heterointerface is obtained between the GaAs buffer layer 12 and InGaAlP layer 13.

In the fifth embodiment, the effect to reduce crystal defects caused by the separation of phosphorus apt to take place in the vicinity of the heterointerface to the GaAs buffer layer 12 is improved, and therefore crystal properties or crystallinity of the InGaAlP layer 13 is enhanced.
(Sixth Embodiment)

Figure 20:
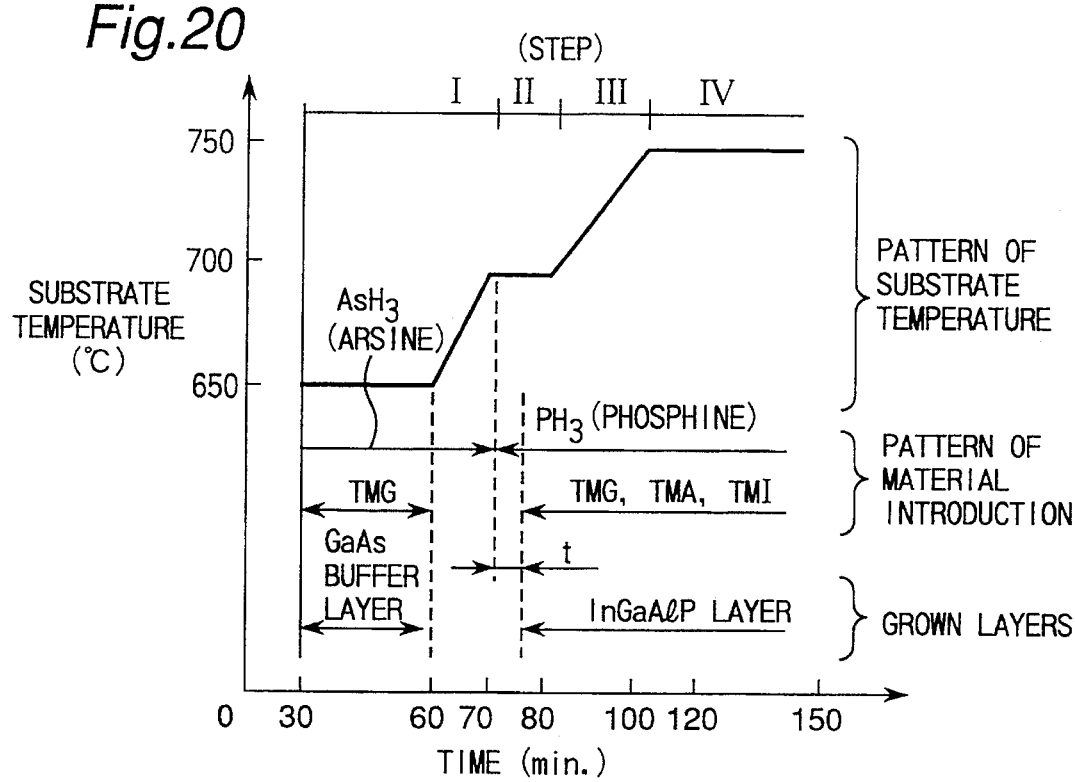
FIG. 20 is a diagram of a producing process along a time axis in a sixth embodiment of the present invention.

FIG. 20 schematically shows a pattern of the surface temperature of a GaAs substrate, a material introduction pattern and grown layers in a case where a semiconductor laser is to be manufactured with the use of a producing method of crystal layers of compound semiconductor of a sixth embodiment of the invention.

The producing method according to the sixth embodiment will be discussed below with reference to FIG. 20.

After the GaAs substrate 11 is set in the reaction container 1 (FIG. 1), the pressure of the interior of the reaction container is reduced to 10–100 torr, and arsine is supplied. After the surface temperature of the GaAs substrate 11 is raised to about 650° C. by heating, TMG is introduced into the container to form the GaAs buffer layer 12 on the GaAs substrate 11. Then, TMG is shut to stop a further growth of the GaAs buffer layer 12. Subsequently, the surface of the GaAs substrate 11 is raised to approximately 700° C. (desirably 720° C. or lower) (step I of FIG. 20).

When the surface temperature of the GaAs substrate 11 is 700° C., arsine is exchanged with phosphine and, TMG, TMA and TMI are supplied a time t later after the exchange. The InGaAlP layer 13 is started to be formed on the GaAs buffer layer 12 (step II in FIG. 20).

A predetermined time after the growth start of the InGaAlP layer 13, while the InGaAlP layer 13 is being grown, the surface temperature of the GaAs substrate 11 is raised to substantially 750° C. (preferably 720°–800° C.) where a good crystal is secured (step III in FIG. 20).

The InGaAlP layer 13 is grown to a predetermined thickness while the GaAs substrate 11 is kept at approximately 750° C. of the surface temperature (step IV in FIG. 20).

Since the replacement of arsine with phosphine is conducted when the surface temperature of the GaAs substrate 11 is not higher than 720° C. in the step II, the GaAs buffer layer 12 is prevented from being quickly decomposed. Thus a sufficient time t is ensured for arsine to be replaced with phosphine. Accordingly, As is prevented from being included in the InGaAlP layer 13. Since the GaAs buffer layer 12 is grown at the low surface temperature of 650° C. of the GaAs substrate 11 and the InGaAlP layer 13 starts its initial growth at approximately 700° C. of the surface temperature of the GaAs substrate 11, a crystal having crystal defects at a smaller density are formed, with crystal defects in the early growing stage of the InGaAlP layer 13 reduced. Since the initial growth of the InGaAlP layer 13 is proceeded when the surface temperature of the GaAs substrate 11 is about 700° C., the separation of P (phosphorus) liable to take place at the InGaAlP layer 13 in the vicinity of the heterointerface with the GaAs buffer layer 12 is avoided. Accordingly, the embodiment accomplishes a better heterointerface in comparison with the prior art, improving the crystal properties of the InGaAlP layer 13.

(Seventh Embodiment)

Figure 21:
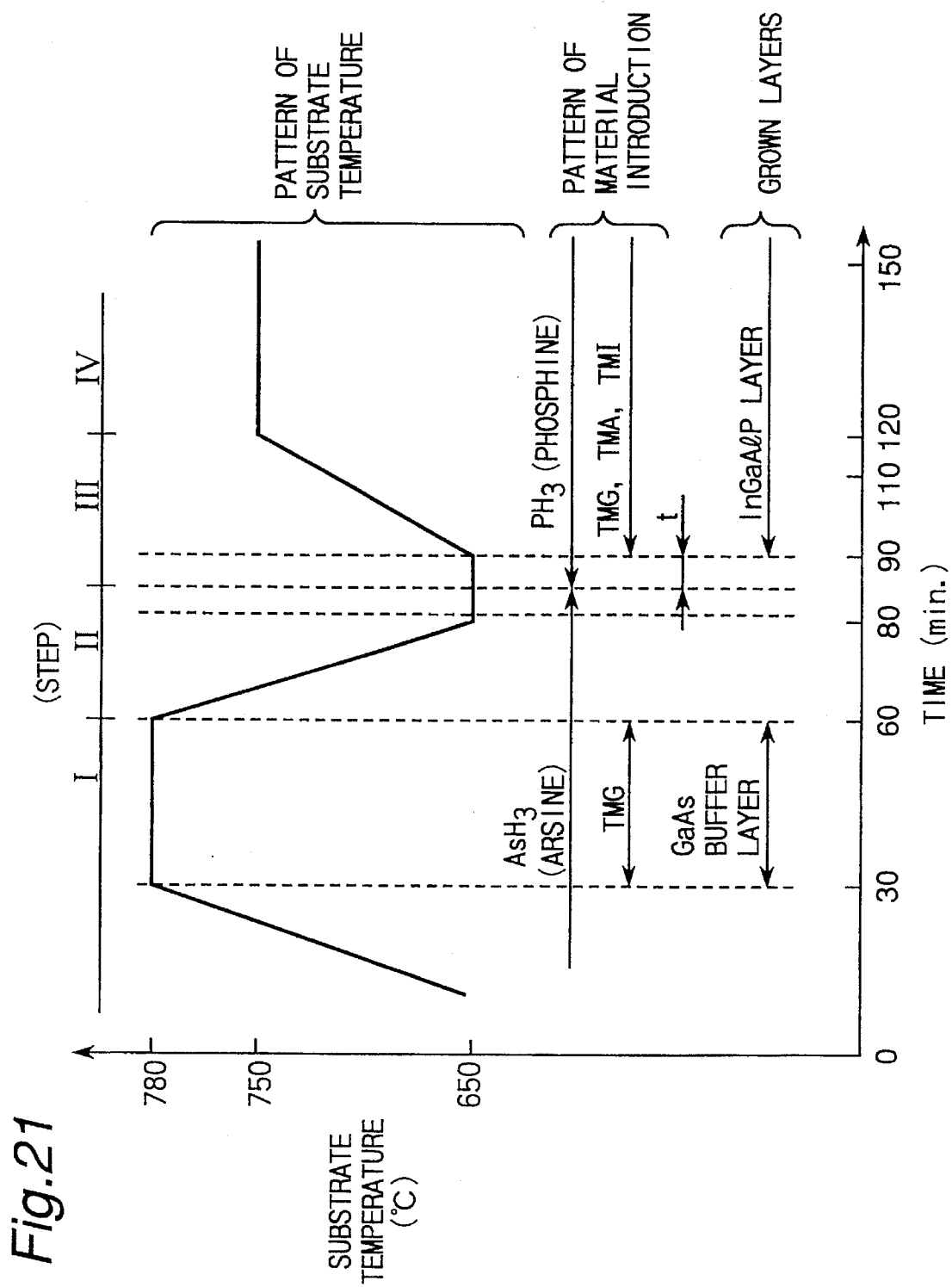
FIG. 21 is a diagram of a producing process along a time axis in a seventh embodiment of the present invention.

A diagram of FIG. 21 schematically shows a pattern of the surface temperature of a GaAs substrate, a material introduction pattern and grown layers when a semiconductor laser is to be manufactured with the use of a producing method of crystal layers of compound semiconductor in a seventh embodiment of the present invention.

The producing method according to the seventh embodiment of the present invention will be described with reference to FIG. 21.

The pressure in the reaction container 1 (FIG. 1) with the GaAs substrate 11 thereinside is reduced to 10–100 torr and arsine is supplied into the reaction container. The GaAs substrate 11 is heated to raise its surface temperature to high 720°–800° C. Then, TMG is supplied to grow the GaAs buffer layer 12 on the GaAs substrate 11. To stop the growth of the GaAs buffer layer 12, the supply of TMG is subsequently stopped (step I in FIG. 21).

The surface temperature of the GaAs substrate 11 is then lowered to 650° C. or so (desirably 600°–680° C.) (step II of FIG. 21).

Gas supply is switched from Arsine to phosphine. A time t after the gas supply switching, TMG, TMA and TMI are introduced to start the formation of the InGaAlP layer 13 on the GaAs buffer layer. During the growth of the InGaAlP layer 13, the surface temperature of the GaAs substrate is raised to approximately 750° C. (preferably 720°–800° C.) to obtain good crystals (step III in FIG. 21).

While the surface temperature of the GaAs substrate 11 is held approximately at 750° C., the InGaAlP layer 13 is grown to a predetermined thickness (step IV of FIG. 21).

Since in the step II the GaAs buffer layer 12 is grown while the surface temperature of the GaAs substrate 11 is kept at high 720°–800° C., crystal defects of the GaAs buffer layer 12 are reduced. Moreover, the initial growth of the InGaAlP layer 13 is started after the surface temperature of the GaAs substrate 11 is lowered to as low as 650° C. This measure prevents the separation of P (phosphorus) apt to be brought about in the vicinity of the heterointerface with the GaAs buffer layer 12, thereby effectively reducing crystal defects in the InGaAlP layer 13. The crystallinity of the InGaAlP layer 13 is furthermore improved.

When an InGaAlP semiconductor laser device with the structure of FIG. 2(A) was manufactured according to the producing method of this embodiment, the semiconductor laser device operated stably for 10,000 hours or longer at 50° C. with an optical output of 50 mW. Accordingly, the producing method of the present embodiment realizes a semiconductor laser of a short wavelength with superior properties and high reliability.

(Eighth Embodiment)

Figure 22:
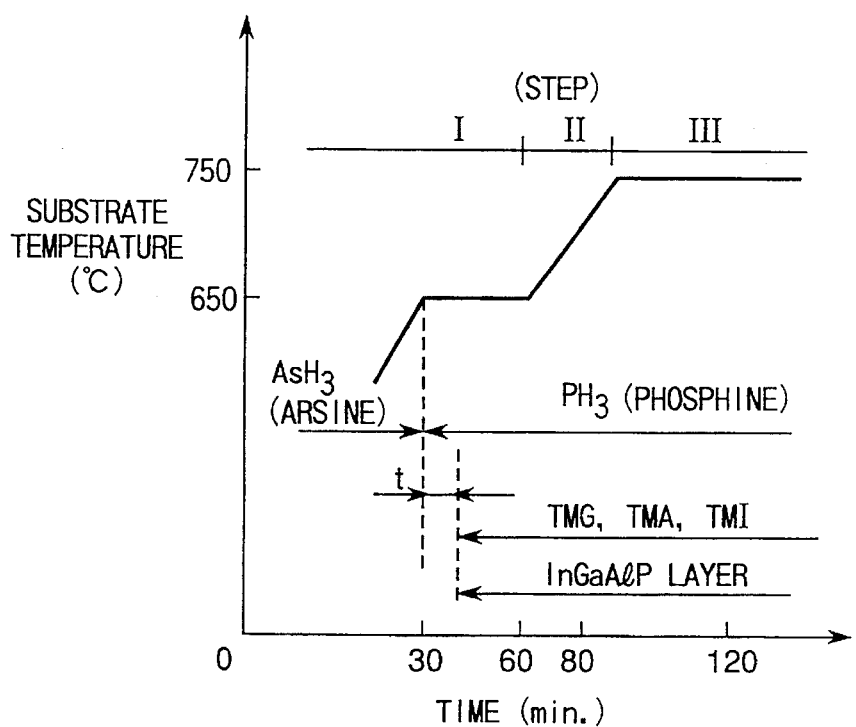
FIG. 22 is a diagram of a producing process along a time axis in an eighth embodiment of the present invention.

FIG. 22 is a schematic diagram showing a temperature pattern of the surface of a GaAs substrate, a material introduction pattern and a grown layer when a semiconductor laser in the structure of FIG. 2(B) is to be manufactured by a producing method of crystal layers of compound semiconductor according to an eighth embodiment of the present invention.

The producing method of the eighth embodiment will be described with reference to FIG. 22. In the eighth embodiment, the buffer layer 12 is not formed and the InGaAlP layer 13 is directly formed on the GaAs substrate 11, unlike the first through seventh embodiments.

The GaAs substrate 11 is put in the reaction container 1 (FIG. 1). The pressure in the reaction container 1 is reduced to 10–100 torr, and arsine is supplied to the reaction container. The GaAs substrate 11 is heated until the substrate surface temperature reaches 650° C. (desirably not higher than 720° C.), and then the gas supply is changed from arsine to phosphine. After a time t from the change of arsine to phosphine, TMG, TMA and TMI are supplied, so that the InGaAlP layer 13 is started to grow on the GaAs substrate 11 (step I in FIG. 22).

Thereafter, while the InGaAlP layer 13 is being grown, the surface temperature of the GaAs substrate 11 is raised to approximately 750° C. (favorably 720°–800° C.) whereat a good crystal is obtained (step II of FIG. 22).

The InGaAlP layer 13 is grown to a predetermined thickness with the surface temperature of the GaAs substrate 11 kept at about 750° C. (step III in FIG. 22).

Since arsine is replaced with phosphine in the step I at a low surface temperature of 650° C. of the GaAs substrate 11, the GaAs substrate 11 is prevented from being rapidly decomposed. Moreover, owing to the prevention of the rapid decomposition of the GaAs substrate 11, a sufficient time is secured as the time t for phosphine to replace arsine, whereby As is refrained from being included in the InGaAlP layer. The initial growth of the InGaAlP layer 13 is started when the surface temperature of the GaAs substrate 11 is a low temperature of 650° C., which prevents the separation of P (phosphorus) apt to occur at the InGaAlP layer in the vicinity of the heterointerface with the GaAs substrate 11, thereby decreasing crystal defects in the InGaAlP layer effectively. In consequence of this, a good heterointerface is formed between the InGaAlP layer 13 and the GaAs substrate 11 and the crystal properties of the InGaAlP layer 13 improve.

The eighth embodiment of the present invention produces a compound semiconductor crystal layer without forming the buffer layer 12. If the compositional ratio of Al in the InGaAlP layer 13 is lower than 0.3, the producing method of the eighth embodiment is more effective than when the GaAs buffer layer or AlGaAs buffer layer is formed.

(Ninth Embodiment)

FIG. 23 is a diagram of a temperature pattern of the surface of a GaAs substrate, an introduction pattern of materials and grown layers when a semiconductor laser in the structure of FIG. 2(B) is to be manufactured using a producing method of crystal layers of compound semiconductor according to a ninth embodiment of the present invention.

The producing method of the embodiment will be described with reference to FIG. 23. The InGaAlP layer 13 is formed directly on the GaAs substrate 11 without forming the buffer layer 12 according to the ninth embodiment, similar to the foregoing eighth embodiment.

The GaAs substrate 11 is disposed in the reaction container 1 (FIG. 1). The pressure inside the reaction container 1 is decreased to 10–100 torr. Arsine is supplied to the container. The GaAs substrate 11 is heated so that the surface temperature becomes 650° C. (desirably 600°–720° C.) (step I in FIG. 23). At 650° C., arsine is switched to phosphine. A time t after the switching, TMG, TMA and TMI preliminarily adjusted at a predetermined mixing ratio are supplied into the reaction container 1 to form an $In_y(Ga_{1-x}Al_x)_{1-y}P$ layer 13 (x=0.7, y=0.5 in the embodiment) on the GaAs substrate 11. Some time after the start of growth of the InGaAlP layer 13, the supply of TMG, TMA and TMI is stopped to thereby temporarily stop the growth of the InGaAlP layer 13 (step II of FIG. 23). The substrate is held at 650° C. in the step II.

After the growth of the InGaAlP layer 13 is once stopped, the GaAs substrate 11 is heated further until the surface temperature reaches approximately 750° C. (720°–800° C.) where a good crystal is attained (step III in FIG. 23). The growth of the InGaAlP layer 13 is stopped during the temperature rise of the GaAs substrate 11 for the following reason. Generally, the alignment of crystal lattices and the concentration of carriers in the InGaAlP layer are varied if the growing temperature for the InGaAlP layer is changed. Accordingly, to make the alignment of crystal lattices and the concentration of carriers constant while the temperature of the GaAs substrate is raised, it is necessary to control the flow rates of material gases and doping materials for the InGaAlP layer. If the flow rates of such materials are changed, then it also becomes necessary to adjust the rate of temperature rise of the substrate. It is considerably troublesome to grow the InGaAlP layer while raising the temperature of the substrate, because of the necessity to regulate the flow rates and the temperature rise rate. As such, the growth of the InGaAlP layer is stopped during the temperature rise of the substrate in the embodiment to eliminate necessity of the regulation of the flow rates during the temperature rise and hence the rate of temperature rise. Since in the present embodiment it is not required to regulate the rate of temperature increase of the substrate, it is possible to increase the surface temperature of the substrate in a short time, thus shortening the whole processing time eventually. Further, since the introduction of the III-group material gas or doping materials is stopped during the time, the amount of use of materials is reduced.

When the surface temperature of the GaAs substrate reaches 750° C., the substrate is maintained at the temperature and the growth of the InGaAlP layer is resumed to a predetermined thickness (step IV of FIG. 23). Compositions x and y are respectively set to be 1.0 and 0.5 in the step III. Although the compositions of the InGaAlP layer 13 are made different in the step II from the step IV in the ninth embodiment, the compositions may be equal in the steps II and IV.

Figure 24:
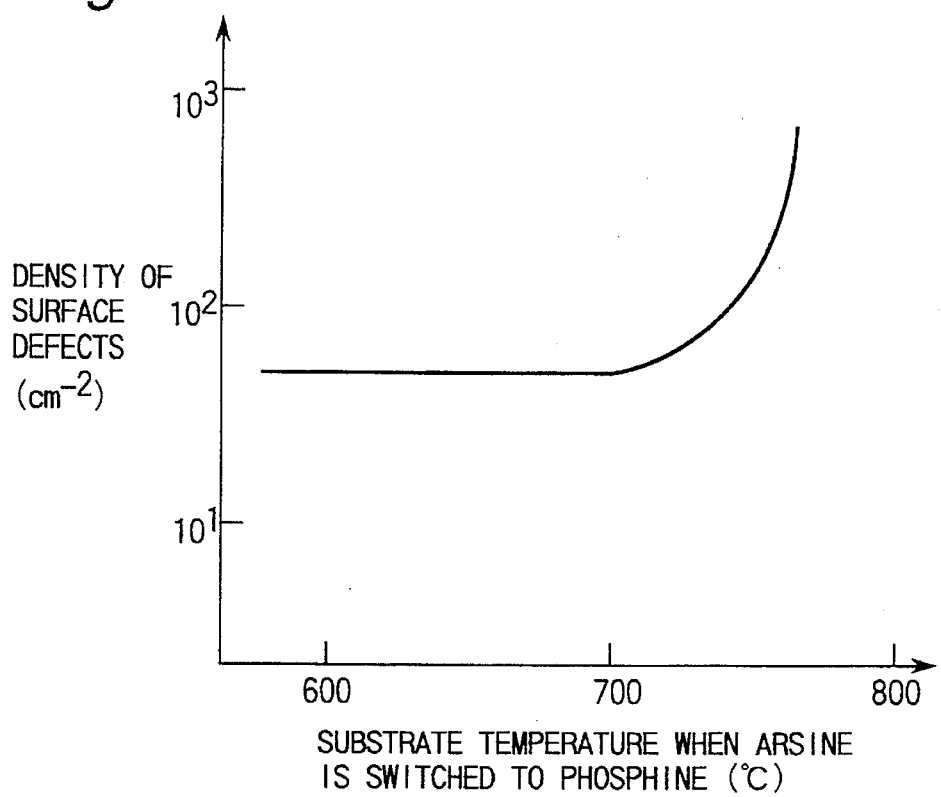
FIG. 24 is a graph of a relation of the surface temperature of a GaAs substrate and density of surface defects when arsine is exchanged with phosphine in the ninth embodiment.

FIG. 24 shows a relation of the density of surface defects to the surface temperature of the GaAs substrate when arsine is switched to phosphine in the ninth embodiment. Although the density of surface defects could not be lower than $10^2$ $cm^{-2}$ in the conventional producing method of FIG. 32, the density of surface defects is decreased to be lower than $10^2$ $cm^{-2}$ when the surface temperature of the GaAs substrate is not higher than 720° C., as shown in FIG. 24. From this, it is obvious that the surface temperature of the GaAs substrate at which introduction gas is switched from arsine to phosphine in the step II is desirably in a range from 600° C. to 720° C. inclusive.

Figure 25:
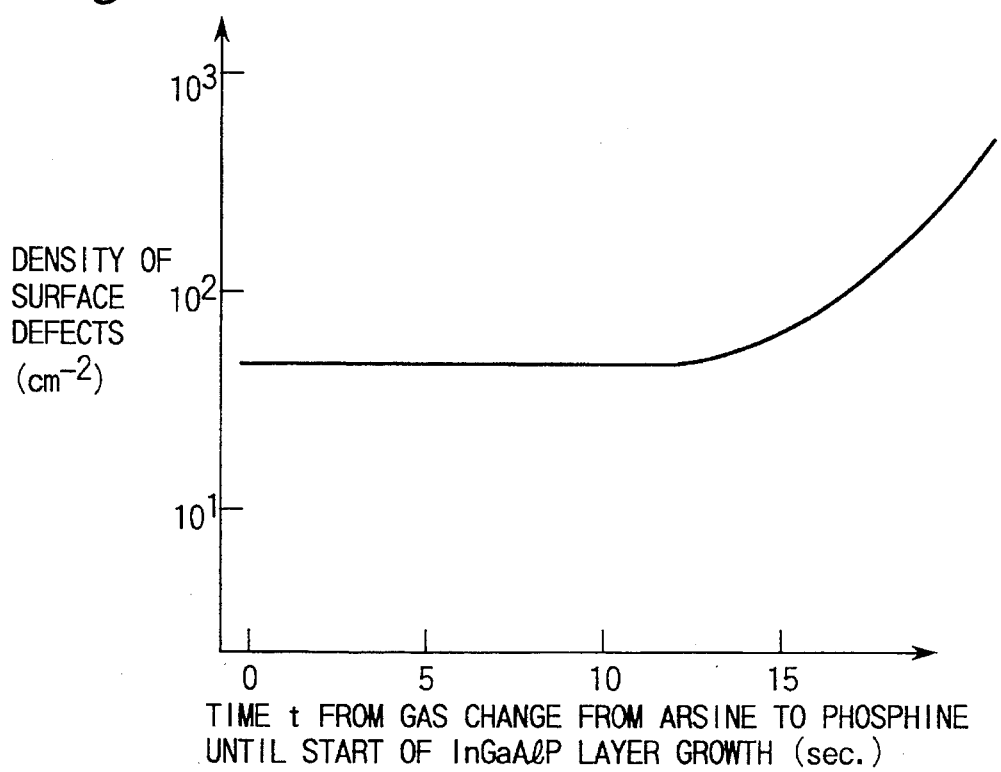
FIG. 25 is a graph of a relation between the time and the density of surface defects before an InGaAlP layer is grown after arsine is switched to phosphine in the ninth embodiment.

FIG. 25 illustrates a relation of the density of surface defects to the time t from the gas switching of arsine to phosphine until the start of the growth of the InGaAlP layer 13 in the ninth embodiment. In the conventional example, the density of surface defects could not be reduced to $10^2$ $cm^{-2}$ or lower. However, if the surface temperature of the GaAs substrate is turned to 650° C. when arsine is switched to phosphine as in the present embodiment, the density of surface defects becomes lower than $10^2$ $cm^{-2}$ when the time t is not longer than 15 sec., as shown in FIG. 25. It is seen from this that the time t before the InGaAlP layer starts to grow after arsine is changed to phosphine in the step II is suitably 0–15 sec. in order to reduce the defects resulting from the separation of P (phosphorus). The time t of 1–15 sec. is more suitable, though, to sufficiently replace arsine with phosphine. Since the rapid decomposition of the GaAs substrate 11 is prevented from taking place owing to the switching of arsine to phosphine at the low temperature of 650° C. in the embodiment, the time t from the gas change from arsine to phosphine until the starting of growth of the InGaAlP layer 13 is set at as long as 5 sec. or so. Therefore, the ambience in the reaction container is sufficiently changed from arsine to phosphine, and As is thus prevented from being included in the InGaAlP layer 13. For the factors above, the embodiment accomplished formation of a good (steep) heterointerface.

Figure 26:
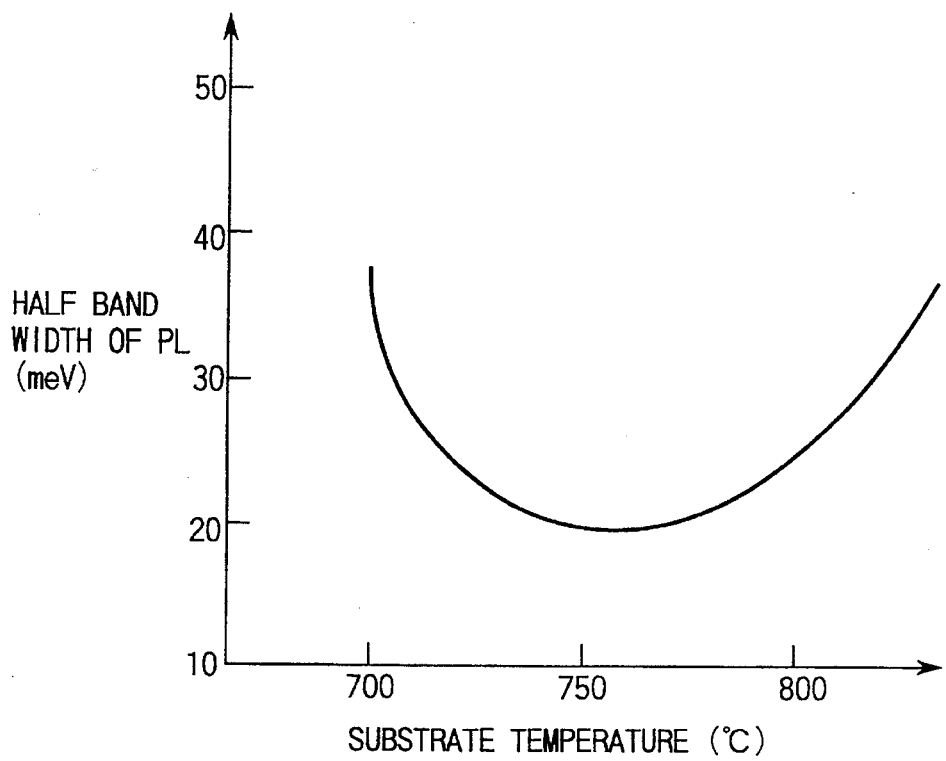
FIG. 26 is a graph of a relation between the surface temperature of the GaAs substrate and the half width of PL in a step III in the ninth embodiment.
Figure 27:
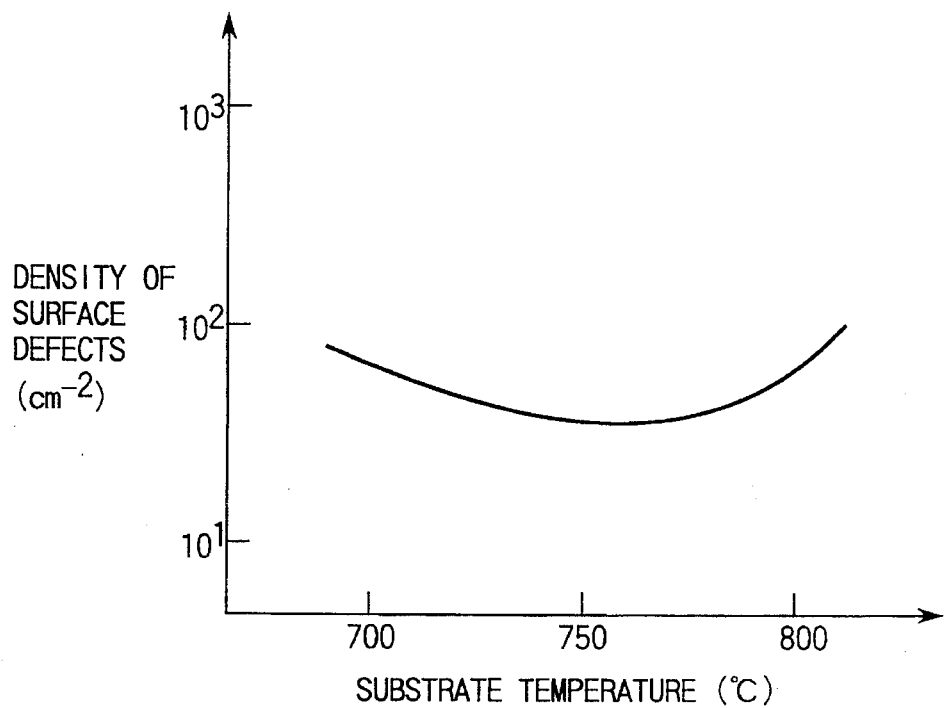
FIG. 27 is a graph of a relationship between the surface temperature of the GaAs substrate and the density of surface defects in the step III in the ninth embodiment.

FIG. 26 represents a relation of the half band width of PL (photoluminescence) of the InGaAlP layer 13 formed in the step IV of the ninth embodiment to the surface temperature of the GaAs substrate 11. Although the half width of PL could not be 25 meV or smaller in the conventional method, the half width of PL could be reduced to smaller than 25 meV in the embodiment so long as the surface temperature of the GaAs substrate 11 was 720°–800° C., as is clear from FIG. 26. The half width was decreased even to approximately 20 meV with the surface temperature being in the vicinity of 750° C. FIG. 27 is a graph of the density of surface defects of the InGaAlP layer 13 grown in the step IV vs. the surface temperature of the GaAs substrate 11. It was not possible to decrease the density of surface defects below $10^2$ $cm^{-2}$ in the prior art, whereas the present embodiment could decrease the density of surface defects to a value of the order of $10^1$ $cm^{-2}$ as shown in FIG. 27 when the surface temperature of the GaAS substrate 11 was in the range of 700°–800° C. according to the embodiment.

Figure 32:
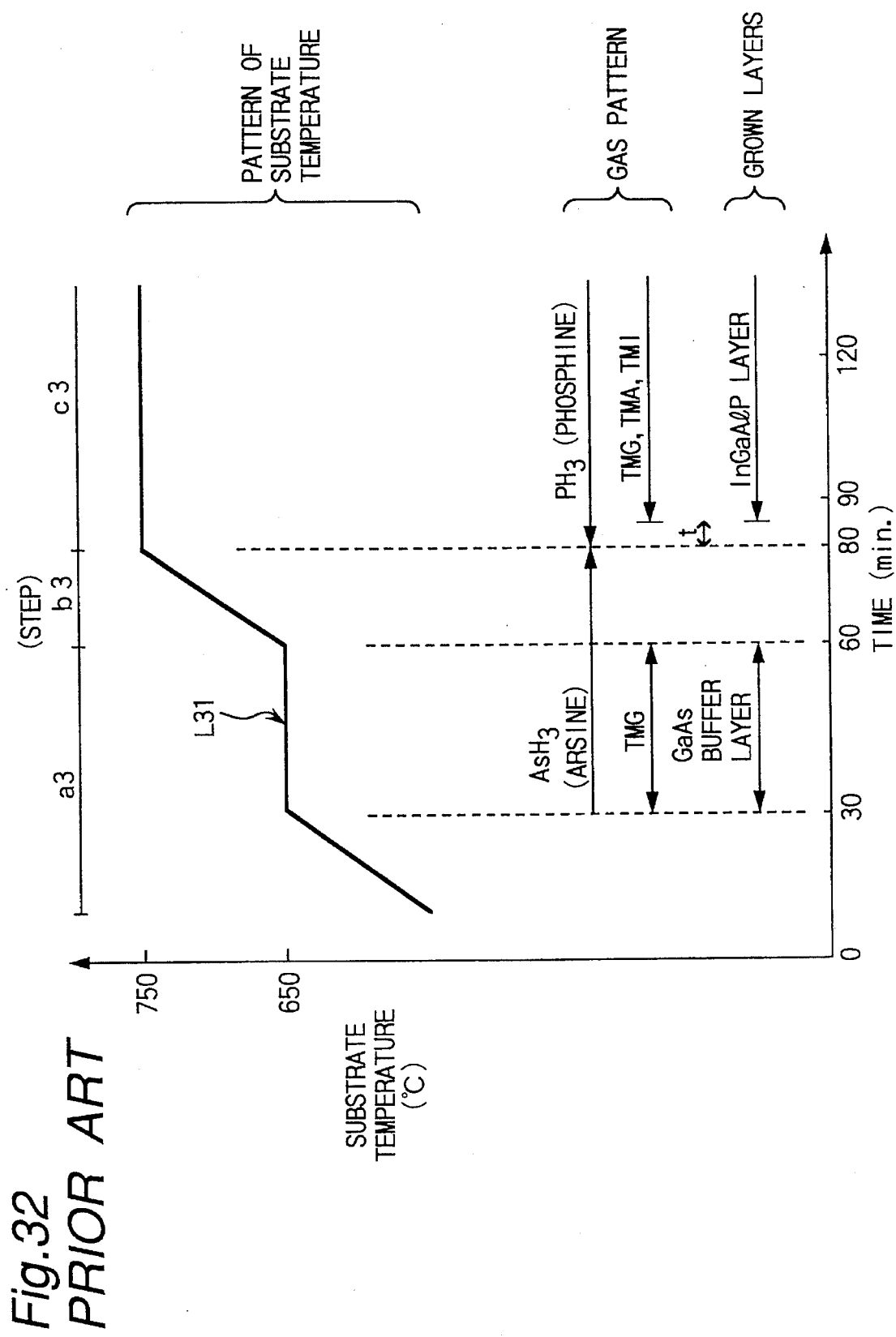
FIG. 32 is a diagram of a process of the conventional producing method along a time axis.

From the above data, it is seen that characteristics of the InGaAlP layer 13 produced by the method of the embodiment are greatly improved as compared with those of the InGaAlP layer obtained by the conventional method of FIG. 32, and that the embodiment is accordingly effective.

InGaAlP semiconductor laser devices with the structure shown in FIG. 2(B) manufactured according to the method of the present embodiment operated stably at 50° C. with an optical output of 40 mW for 10,000 hours or longer. The effectiveness of the embodiment is verified also from this fact. The producing method of the invention realizes a semiconductor laser of a short wavelength with superior characteristics and high reliability.

In the ninth embodiment, composition x, y of the $In_y(Ga_{1-x}Al_x)_{1-y}P$ layer 13 is made different in the step II from the step IV. However, the composition may not be necessarily changed. A favorable result is obtained even when the InGaAlP layer 13 is grown in the same composition in the steps II and IV.

(Tenth Embodiment)

Figure 28:
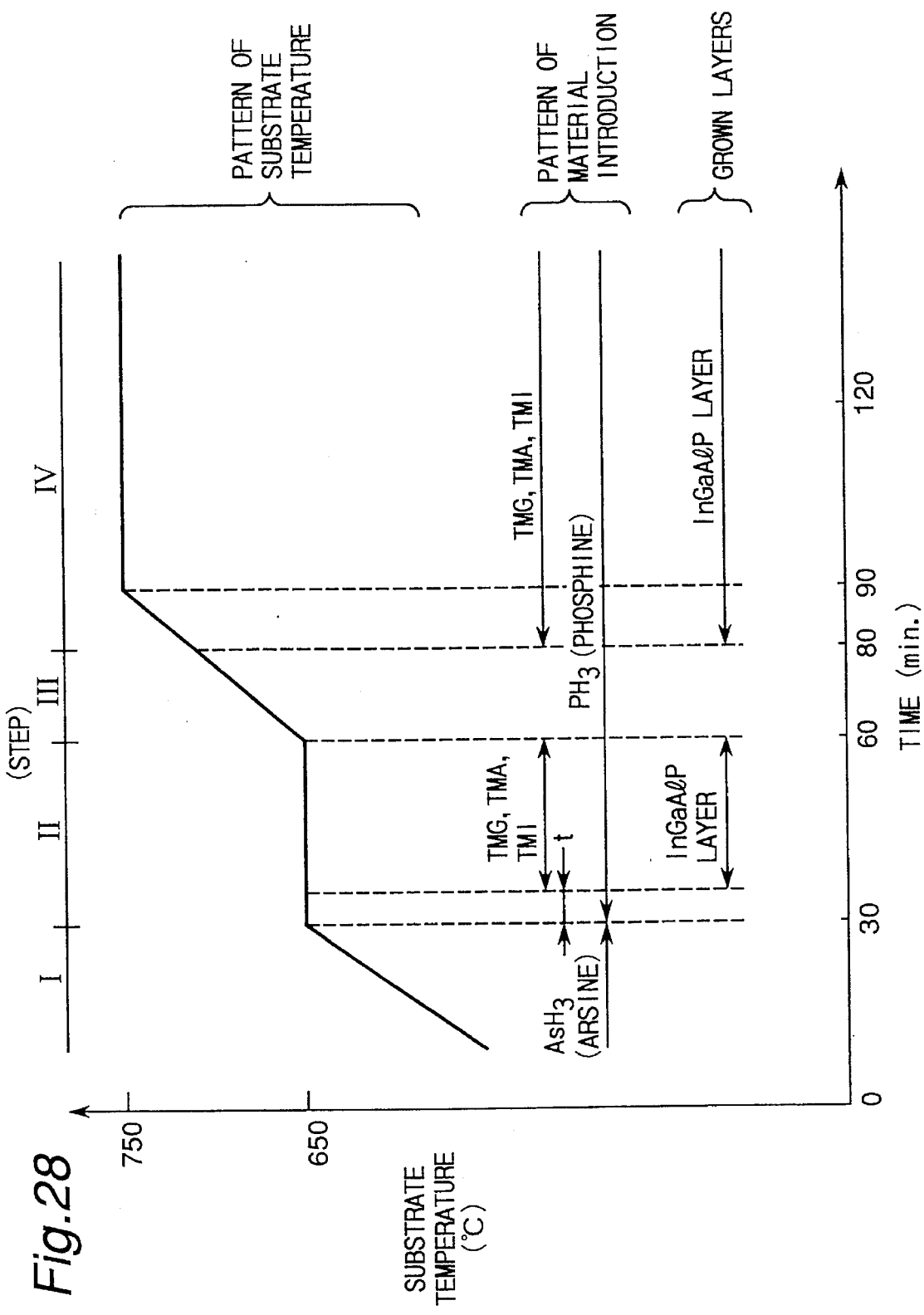
FIG. 28 is a diagram of a producing process along a time axis in a 10th embodiment of the present invention.

FIG. 28 shows a temperature pattern of the surface of a GaAs substrate, an introduction pattern of materials and grown layers when a semiconductor laser in the structure shown in FIG. 2(B) is to be manufactured by a producing method of crystal layers of compound semiconductor in a tenth embodiment of the present invention.

The tenth embodiment will now be described with reference to FIG. 28. Steps I and II of the tenth embodiment shown in FIG. 28 are equal to the steps I and II of the ninth embodiment of FIG. 23 and therefore, the description of the steps I and II will be omitted and only steps III and IV of the tenth embodiment will be discussed below.

After the growth of the InGaAlP layer 13 is stopped, the surface temperature of the GaAs substrate 11 is raised to about 750° C. (suitably 720°–800° C.) to obtain a good crystal by heating the GaAs substrate 11 in the steps III and IV. On the other hand, during the temperature rise from 650° C. to 750° C. of the GaAs substrate 11, TMA, TMG and TMI are introduced again at around 720° C. of the substrate temperature to start the growth of the InGaAlP layer 13 again. When the temperature reaches 750° C., this temperature is maintained and the InGaAlP layer 13 is made to continue to grow to a predetermined thickness.

In the ninth embodiment wherein the InGaAlP layer 13 is not grown at all during the temperature rise of the substrate up to 750° C., crystal defects due to the separation of phosphorus are still apt to be generated during the temperature rise although not so many as in the case where the InGaAlP layer 13 is formed on the GaAs substrate or GaAs buffer layer. The tenth embodiment taking this inconvenience into consideration starts the growth of the InGaAlP layer 13 again when the substrate is at a relatively low temperature to thereby prevent the separation of P (phosphorus) during the temperature rise of the substrate which is apt to occur even in the ninth embodiment. Accordingly, the tenth embodiment is effective to reduce the generation of crystal defects more than the ninth embodiment. Actually, the yield of semiconductor laser devices manufactured according to the method of the embodiment is higher than that in the ninth embodiment. Moreover, various kinds of semiconductor laser devices of different wavelengths manufactured by the producing method of this embodiment showed stabler device characteristics.

(11th Embodiment)

Figure 29:
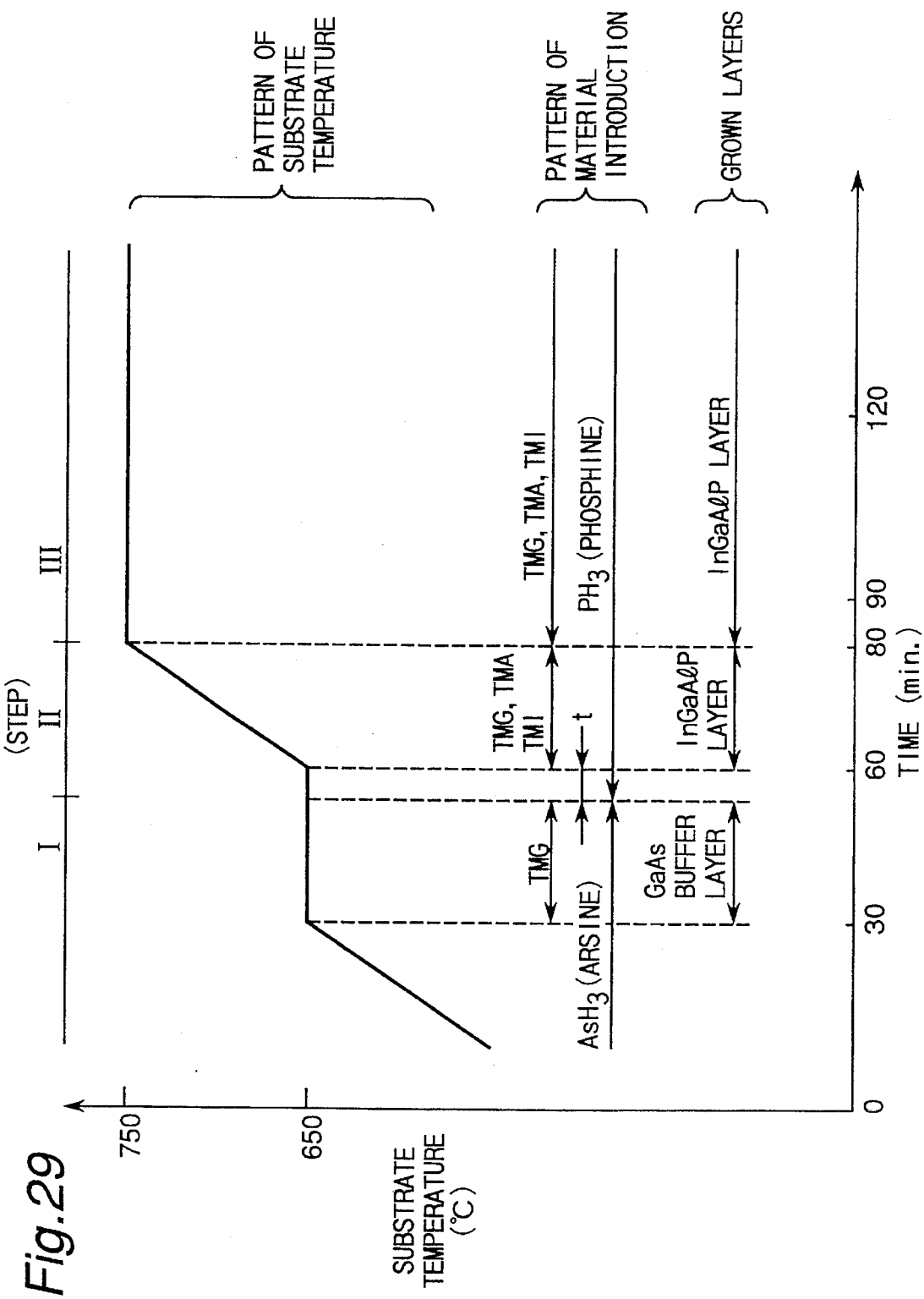
FIG. 29 is a diagram of a producing process along a time axis in an 11th embodiment of the present invention.

FIG. 29 is a diagram of a temperature pattern of the surface of a GaAs substrate, an introduction pattern of materials and grown layers when a semiconductor laser with the structure illustrated in FIG. 2(A) is to be manufactured according to a producing method of an 11th embodiment of the present invention.

The producing method of crystal layers of compound semiconductor according to the 11th embodiment will be discussed with reference to FIG. 29. The InGaAlP layer is formed after the buffer layer is formed on the GaAs substrate in the 11th embodiment.

First, the GaAs substrate 11 is put in the reaction container 1 (FIG. 1). After the pressure in the reaction container 1 is reduced to 10–100 torr, arsine is fed in the reaction container. The GaAs substrate 11 is heated until the surface temperature thereof reaches 650° C. (desirably 600°–720° C.). When the surface temperature reaches 650° C., TMG is introduced into the reaction container 1 for the growth of the GaAs buffer layer 12. The temperature of the substrate is retained at 650° C. during the time (step I).

With the temperature of the substrate maintained at 650° C., arsine is exchanged with phosphine. Five seconds (t=5 sec.) after arsine is changed to phosphine, while the GaAs substrate is heated to 750° C. (desirably 720°–800° C.) whereat good crystals of the InGaAlP layer can be obtained, TMG, TMA and TMI adjusted at a predetermined mixing ratio beforehand are introduced into the reaction container, so that the $In_y(GA_{1-x}Al_x)_{1-y}P$ layer 13 ($0 \leq x \leq 1$, $0 \leq y \leq 1$) is formed (step II). The composition x, y of the $In_y(Ga_{1-x}A_x)_{1-y}P$ layer 13 ($0 \leq x \leq 1$, $0 \leq y \leq 1$) is 0.70 for x and 0.50 for y, respectively.

When the temperature of the substrate reaches 750° C., the mixing ratio of TMG, TMA and TMI is changed from that in the step II with the temperature of the GaAs substrate 11 being held as it is, whereby an $In_y(Ga_{1-x}Al_x)_{1-y}P$ layer (x=1.0, y=0.50) of different composition x, y from in the step II is formed (step III).

According to the 11th embodiment, similar to some of the other embodiments, the switching from arsine to phosphine using a sufficient time and the initial growth of the InGaAlP layer are carried out when the temperature of the substrate is below 720° C., and then the temperature of the substrate is raised to 750° C. during the growth of the InGaAlP layer. Therefore, inclusion of arsenic to the InGaAlP layer in its early growing stage is prevented and crystal defects resulting from the separation of P (phosphorus) in the vicinity of the heterointerface are reduced, so that a steep heterointerface is formed. The obtained InGaAlP layer shows good crystal properties.

The temperature of the substrate at which the InGaAlP layer is grown in the embodiment is set depending upon the compositions x and y of the InGaAlP layer. In other words, the InGaAlP layer is grown at a temperature suitable for the compositions of the InGaAlP layer. Therefore, in comparison with the third embodiment (FIG. 13), etc. which grows the InGaAlP layer without changing the composition thereof, the InGaAlP layer obtained according to the 11th embodiment presents more favorable crystallinity.

It is needless to say that the InGaAlP layer 13 formed in the steps II and III may be of another composition than the above-described one.

(12th Embodiment)

Figure 30:
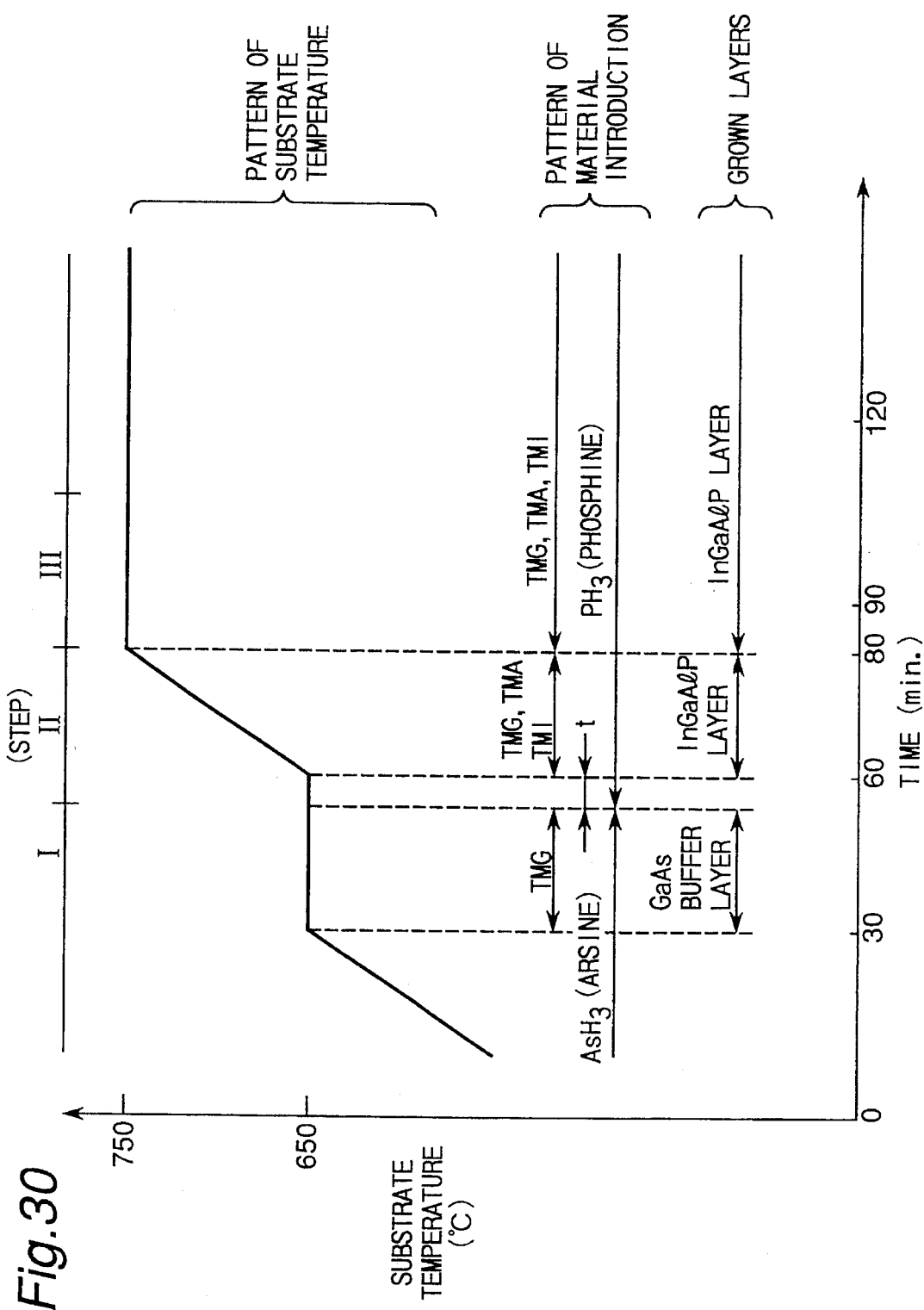
FIG. 30 is a diagram of a producing process along a time axis in a 12th embodiment of the present invention.
Figure 31:
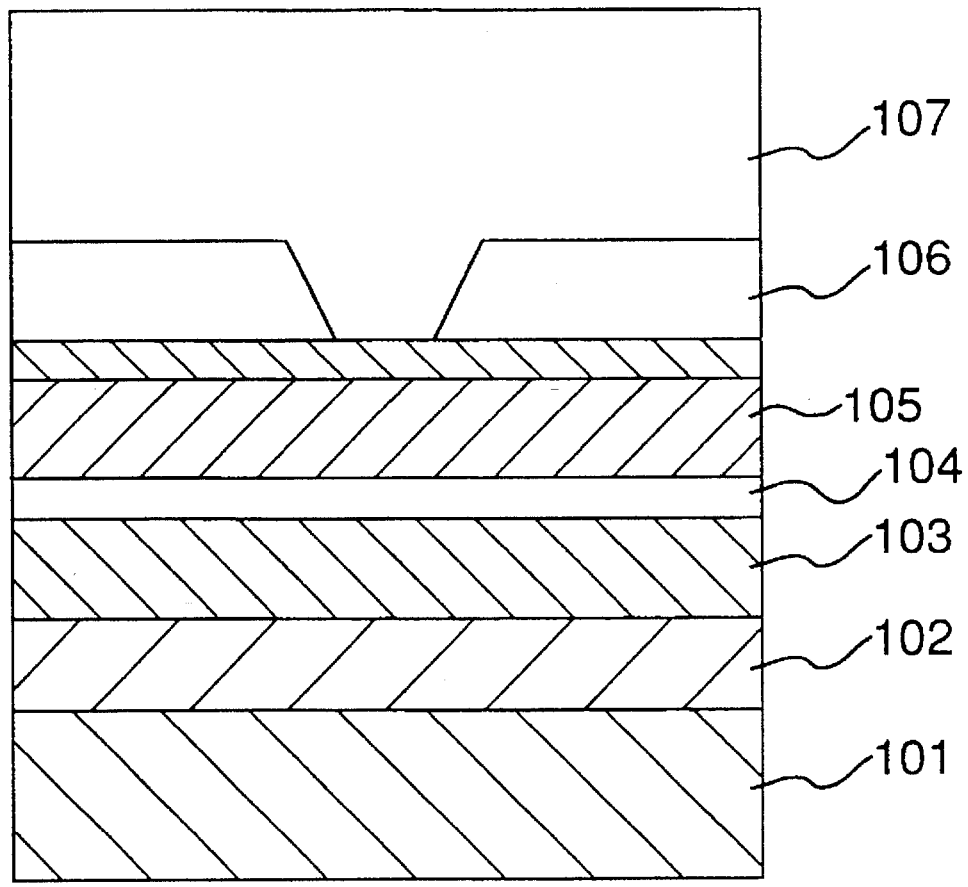
FIG. 31 is a diagram showing the structure of a semiconductor laser manufactured according to a conventional producing method of crystal layers of compound semiconductor.

FIG. 30 is a diagram of a surface temperature pattern of a GaAs substrate, an introduction pattern of materials and grown layers when a semiconductor laser is to be manufactured by a producing method of crystal layers of compound semiconductor according to a 12th embodiment of the present invention.

The method of this embodiment differs from the method of the 11th embodiment only in composition of the $In_y(Ga_{1-x}Al_x)_{1-y}P$ layer to be grown in the steps I and II. More specifically, the composition x, y of the $In_y(Ga_{1-x}Al_x)_{1-y}P$ layer 13 ($0 \leq x \leq 1$, $0 \leq y \leq 1$) is changed in two ways during and after the temperature rise of the substrate in the 11th embodiment, while the composition of the InGaAlP layer 13 is changed in various ways in the instant embodiment during the temperature rise of the substrate. Concretely, when the InGaAlP layer starts to grow, x=0.50 and y=0.50. When the temperature rise is completed, x=1.0 and y=0.50. The composition x is gradually changed from 0.50 to 1.0 during the rise of the temperature of the substrate.

According to the 12th embodiment, since the composition of the InGaAlP layer is gradually changed so that a sudden change of the composition is avoided, the resulting InGaAlP layer shows more favorable crystal properties than in the 11th embodiment.

Although the composition of the InGaAlP layer is changed only during the temperature rise of the substrate in the above example, changing of the composition has been proven to be effective even if it is carried out only after the temperature rise. Needless to say, the composition may be changed in the whole period of the growth, or only partly in the whole period.

Compositions of InGaAlP active layers 14 in semiconductor lasers of different wavelengths are different each other. The semiconductor laser with the InGaAlP clad layer 13 and buffer layer 12 formed in any of the foregoing methods has been improved in reliability and characteristics as compared with the prior art, irrespective of the composition of the InGaAlP active layer 14. From this, it is seen that the present invention is effective to obtain such improved semiconductor lasers.

In each of the foregoing embodiments, trimethyl aluminum (TMA), trimethyl gallium (TMG) and trimethyl indium (TMI) which are methylic organometals, and arsine (AsH$_3$) and phosphine (PH$_3$) are employed as materials for crystal layers of compound semiconductor. Other materials such as triethyl aluminum (TEM), triethyl gallium (TEG) and triethyl indium (TEI) which are ethylic organometals and, tertiary butyl phosphine (TBP) and tertiary butyl arsine (TBAs) which are organic V-group materials may be employable.

Although the description of the above embodiments is related to the manufacture of semiconductor lasers, the producing method of the present invention is naturally applicable to the manufacture of light emitting diodes.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of producing a compound semiconductor crystal layer wherein an In$_y$(Ga$_{1-x}$Al$_x$)$_{1-y}$P layer (0≦x≦1, 0≦y≦1) is grown on a GaAs substrate directly or via a buffer layer by way of a metal organic chemical vapor deposition method with the use of a III-group material gas including a III-group element or elements and a V-group material gas including a V-group element or elements, which comprises the steps of:

(a) introducing a gas including an arsenic-based material as the V-group material gas into a reaction container for formation of crystals; and (b) switching the V-group material gas from the gas including the arsenic-based material to a gas including a phosphorus-based material, and introducing the III-group material gas into the reaction container, thereby forming an In$_y$(Ga$_{1-x}$Al$_x$)$_{1-y}$P layer, said step (b) consisting of a first period including a time when the In$_y$(Ga$_{1-x}$Al$_x$)$_{1-y}$P layer is started to grow and a second period following the first period, wherein in said first period a Q$_V$/Q$_{III}$ ratio of a molar flow rate Q$_V$ of the V-group material gas to a molar flow rate Q$_{III}$ of the III-group material gas is set to a value higher than a predetermined value, and in said second period the Q$_V$/Q$_{III}$ ratio is lowered from said higher value to the first value and then maintained at a second value.

2. A method of producing a compound semiconductor crystal layer according to claim 1, which continuously lowers said Q$_V$/Q$_{III}$ ratio from the higher value to the second value.

3. A method of producing a compound semiconductor crystal layer according to claim 1, wherein said higher value is 500 or larger, and said second value is not larger than 500.

4. A method of producing a compound semiconductor crystal layer according to claim 1, which, in said step (b), switches said V-group material gas and starts to grow the In$_y$(Ga$_{1-x}$Al$_x$)$_{1-y}$P layer at such a low temperature of the substrate that does not decompose GaAs, and then grows the In$_y$(Ga$_{1-x}$Al$_x$)$_{1-y}$P layer while raising the temperature of the substrate.

5. A method of producing a compound semiconductor crystal layer according to claim 4, wherein said low temperature of the substrate is not higher than 720° C., and which method raises the temperature of the substrate from said low temperature up to a high temperature which is higher than said low temperature and is also in a range of 720° C. through 800° C., and then maintains the temperature of the substrate at said high temperature.

6. A method of producing a compound semiconductor crystal layer according to claim 4, wherein said step (a) includes a step of growing an Al$_x$Ga$_{1-x}$As buffer layer (0≦x≦1) on said GaAs substrate.

7. A method of producing a compound semiconductor crystal layer wherein an In$_y$(Ga$_{1-x}$Al$_x$)$_{1-y}$P layer (0≦x≦1, 0≦y≦1) is grown on a GaAs substrate directly or via a buffer layer by way of a metal organic chemical vapor deposition method with the use of a III-group material gas including a III-group element or elements and a V-group material gas including a V-group element or elements, which comprises the steps of:

(c) introducing an arsenic-based material into a reaction container for formation of crystals;

(d) after the (c) step, setting a substrate temperature of said GaAs substrate at a first temperature not higher than 720° C. and switching the arsenic-based material to a phosphorus-based material; and (e) after the (d) step, a time later, setting the substrate temperature of the GaAs substrate at a second temperature not higher than 720° C. and starting to grow the In$_y$(Ga$_{1-x}$Al$_x$)$_{1-y}$P layer.

8. A method of producing a compound semiconductor crystal layer according to claim 7, which further comprises a step of, after said (e) step, raising the substrate temperature to a third temperature during the growth of the In$_y$(Ga$_{1-x}$Al$_x$)$_{1-y}$P layer, said third temperature being higher than said first and second temperatures and also in a range of 720° to 800° C., so that the In$_y$(Ga$_{1-x}$Al$_x$)$_{1-y}$P layer is grown while the substrate is maintained at the third temperature.

9. A method of producing a compound semiconductor crystal layer according to claim 8, wherein said (c) step includes a step of growing an Al$_x$Ga$_{1-x}$As buffer layer (0≦x≦1) on said substrate.

10. A method of producing a compound semiconductor crystal layer according to claim 9, which, during the growth of the Al$_x$Ga$_{1-x}$As buffer layer, raises said substrate temperature from a temperature at which the growth of said Al$_x$Ga$_{1-x}$As buffer layer is started up to said first temperature.

11. A method of producing a compound semiconductor crystal layer according to claim 9, setting said second temperature of the GaAs substrate, at which the growth of said In$_y$(Ga$_{1-x}$Al$_x$)$_{1-y}$P layer is started, to be higher than a temperature at which said Al$_x$Ga$_{1-x}$As buffer layer grows.

12. A method of producing a compound semiconductor crystal layer according to claim 9, setting said second temperature of the GaAs substrate, at which the growth of said $In_y(Ga_{1-x}Al_x)_{1-y}P$ layer is started, to be lower than a temperature at which said $Al_xGa_{1-x}As$ buffer layer grows.

13. A method of producing a compound semiconductor crystal layer according to claim 8, which stops the growth of said $In_y(Ga_{1-x}Al_x)_{1-y}P$ layer, after starting the growth of said $In_y(Ga_{1-x}Al_x)_{1-y}P$ layer, in at least a part of a period in which said substrate temperature is raised from said second temperature to said third temperature.

14. A method of producing a compound semiconductor crystal layer according to claim 13, which stops the growth of said $In_y(Ga_{1-x}Al_x)_{1-y}P$ layer in the whole period in which said substrate temperature is raised from said second temperature to said third temperature, and resumes the growth of said $In_y(Ga_{1-x}Al_x)_{1-y}P$ layer after said third temperature is reached.

15. A method of producing a compound semiconductor crystal layer according to claim 13, which resumes the growth of said $In_y(Ga_{1-x}Al_x)_{1-y}P$ layer at some point in the period in which said substrate temperature is raised to said third temperature.

16. A method of producing a compound semiconductor crystal layer according to claim 8, wherein composition x and/or y ($0 \leq x \leq 1$, $0 \leq y \leq 1$) of the $In_y(Ga_{1-x}Al_x)_{1-y}P$ layer grown while said substrate temperature is raised from said second temperature to said third temperature is made different from that of the $In_y(Ga_{1-x}Al_x)_{1-y}P$ layer grown after said third temperature is reached.

17. A method of producing a compound semiconductor crystal layer according to claim 16, which grows said $In_y(Ga_{1-x}Al_x)_{1-y}P$ layer varying the composition x and/or y in at least a part of a whole growing time of said $In_y(Ga_{1-x}Al_x)_{1-y}P$ layer.

* * * * *